United States Patent
Ikesue

(10) Patent No.: US 7,960,191 B2
(45) Date of Patent: Jun. 14, 2011

(54) COMPOSITE LASER ELEMENT AND LASER OSCILLATOR EMPLOYING IT

(76) Inventor: Akio Ikesue, Nagoya (JP)

(*) Notice: Subject to any disclaimer, the term of this patent is extended or adjusted under 35 U.S.C. 154(b) by 804 days.

(21) Appl. No.: 11/596,815

(22) PCT Filed: May 16, 2005

(86) PCT No.: PCT/JP2005/008909
§ 371 (c)(1),
(2), (4) Date: Nov. 1, 2007

(87) PCT Pub. No.: WO2005/112208
PCT Pub. Date: Nov. 24, 2005

(65) Prior Publication Data
US 2008/0298407 A1    Dec. 4, 2008

(30) Foreign Application Priority Data
May 17, 2004  (JP) ................. 2004-146658

(51) Int. Cl.
*H01L 21/00* (2006.01)
(52) U.S. Cl. ............. 438/22; 438/29; 438/38; 372/41
(58) Field of Classification Search ............ 438/22, 438/29, 38; 372/41
See application file for complete search history.

(56) References Cited

U.S. PATENT DOCUMENTS

| | | | |
|---|---|---|---|
| 5,113,472 A * | 5/1992 | Gualtieri et al. | 385/130 |
| 5,441,803 A | 8/1995 | Meissner | 428/220 |
| 5,846,638 A | 12/1998 | Meissner | 428/220 |
| 5,852,622 A | 12/1998 | Meissner | 372/139 |
| 6,151,347 A * | 11/2000 | Noel et al. | 372/45.01 |
| 2003/0214986 A1 | 11/2003 | Kouta et al. | |

FOREIGN PATENT DOCUMENTS

| | | |
|---|---|---|
| JP | 5-175591 | 7/1993 |
| JP | 11-031860 A | 2/1999 |
| JP | 2002-57388 | 2/2002 |
| JP | 2003-20288 | 1/2003 |

OTHER PUBLICATIONS

English machine translation of Japanese Patent JP 2003-020288 dated Jan. 24, 2003.*
Sugiyama et al; "Direct Bonding of Ti:sapphire laser crystals;" Applied Optics, vol. 37, No. 12; (Apr. 20, 1998) pp. 2407-2410.
Ikesue et al; "Fabrication and Optical Properties of High-Performance Polycrystalline Nd:YAG Ceramics for Solid-State Lasers;" J. Amer. Ceramics Soc.; vol. 78, No. 4 (1995); pp. 1033-1040.

* cited by examiner

*Primary Examiner* — Thinh T Nguyen
(74) *Attorney, Agent, or Firm* — Kratz, Quintos & Hanson, LLP

(57) ABSTRACT

The present invention provides a composite laser element that solves the problems encountered with a conventional laser medium composed of an Nd:YAG single crystal or polycrystal, and exhibits excellent performance as a laser medium. The invention relates to a laser element in which two or more crystal materials are joined, wherein (1) at least one of the crystal materials is a transparent crystal material capable of laser oscillation, including a laser active element in a matrix crystal, and (2) the transparent crystal material capable of laser oscillation and/or a second crystal body joined thereto is a polycrystal.

1 Claim, 18 Drawing Sheets

FIG. 2
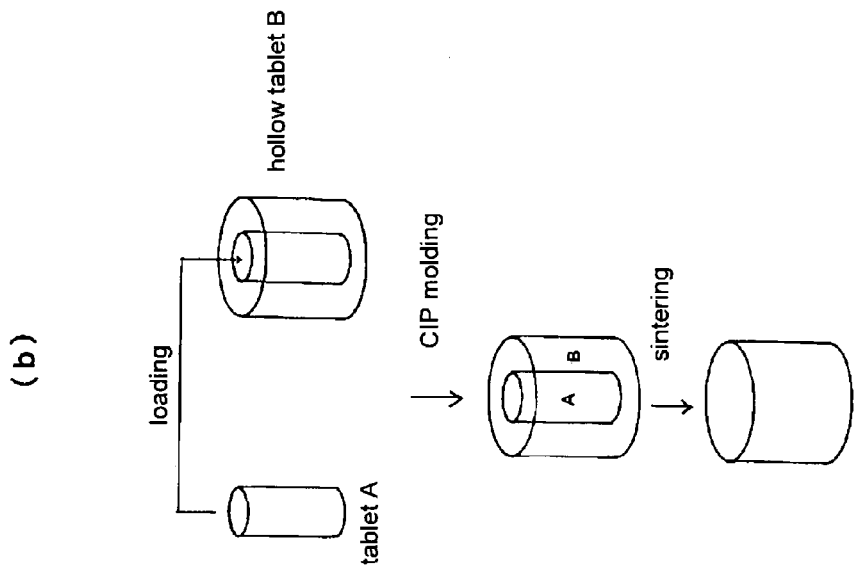
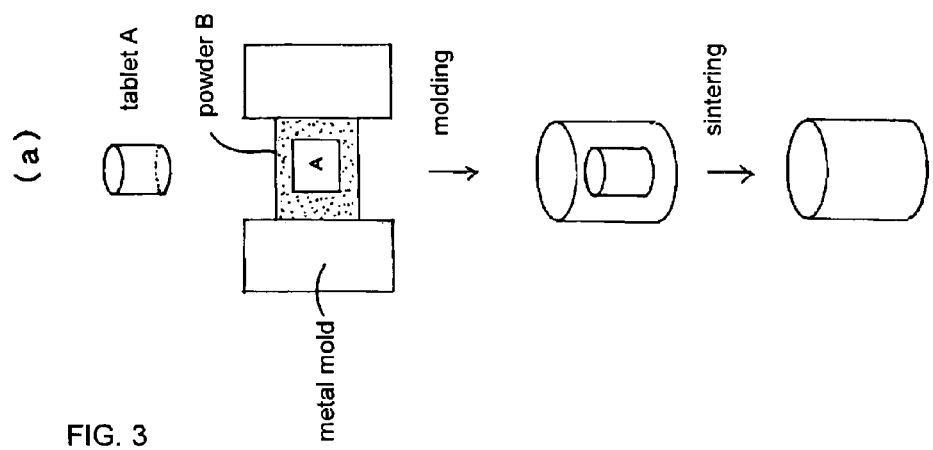
FIG. 3
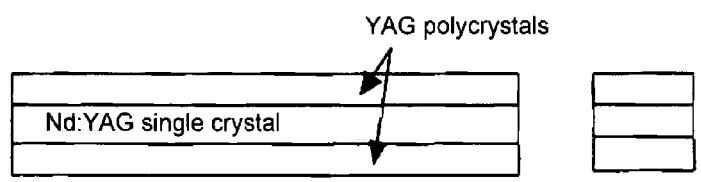

FIG. 4
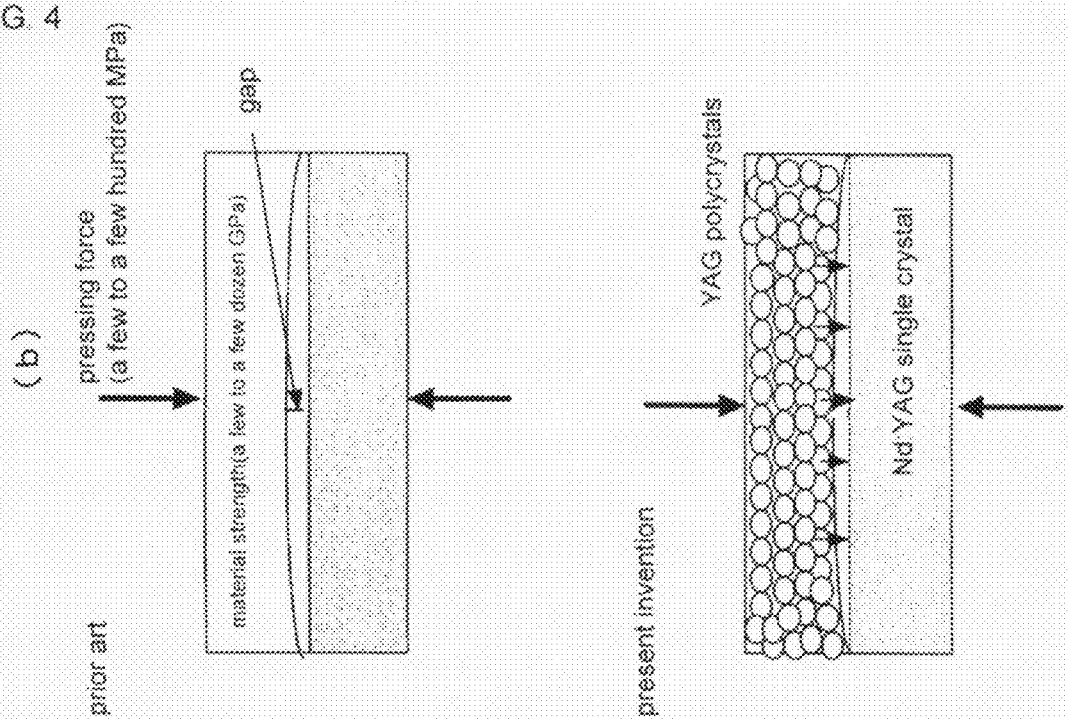
FIG. 5
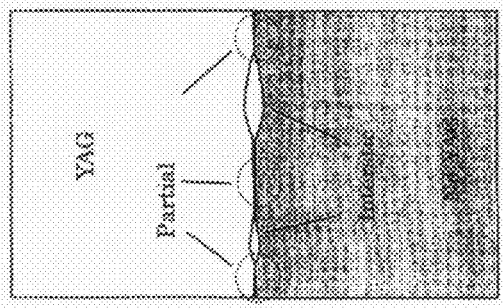
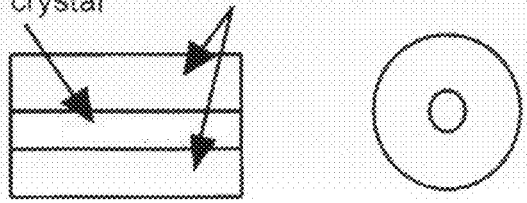

FIG. 6
[After bonding]
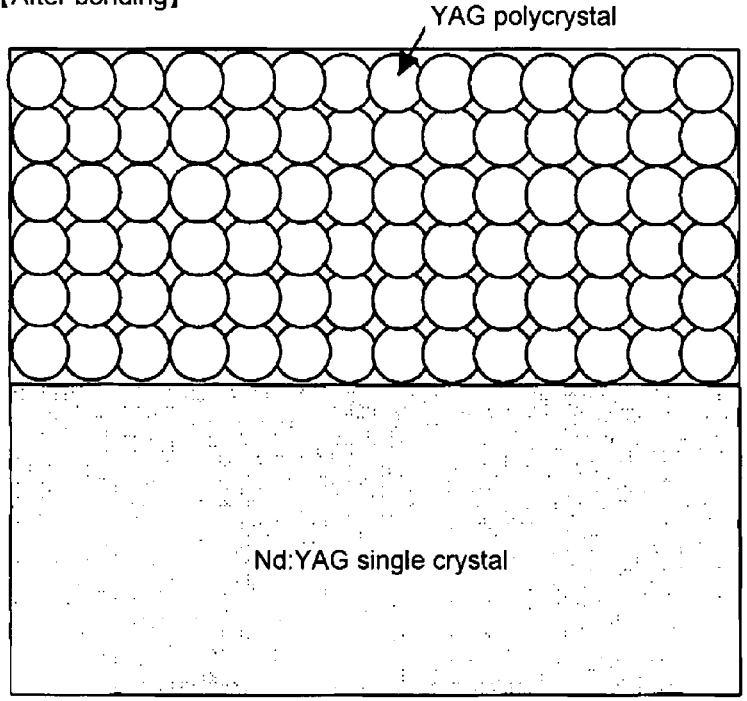
[Bonding high-temperature heat treatment]
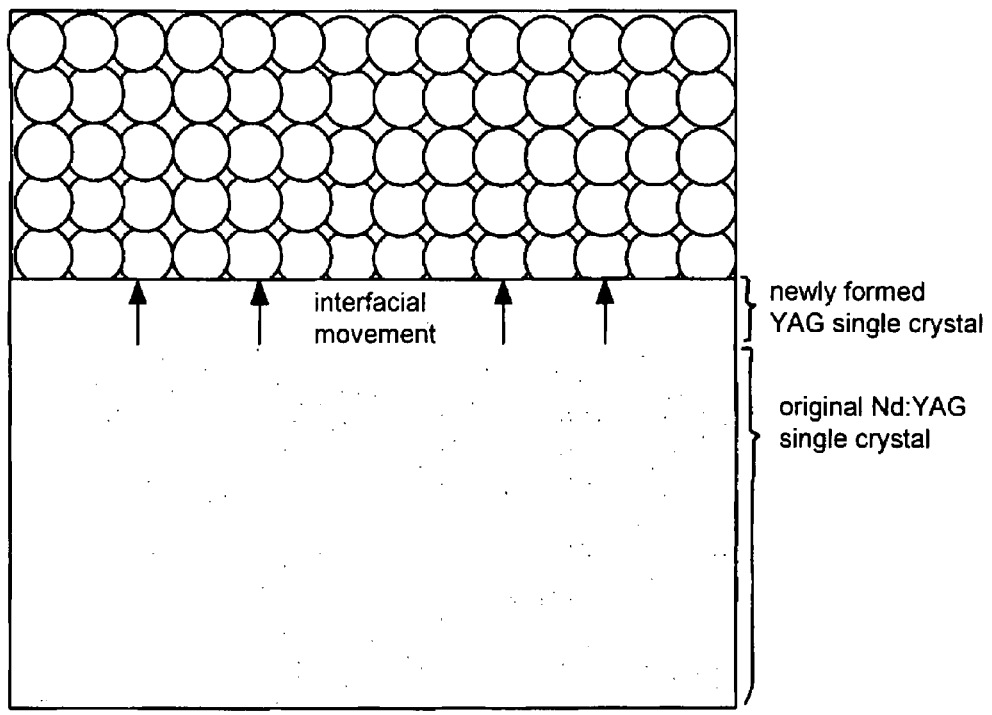

【Example 10】

【Example 4】

Transmission wavefront of sample (A) immediately after joining and (B) after 1000 hours of repeated excitation Transmission wavefront of sample (A) immediately after joining and (B) after 2 hours of repeated excitation FIG. 11
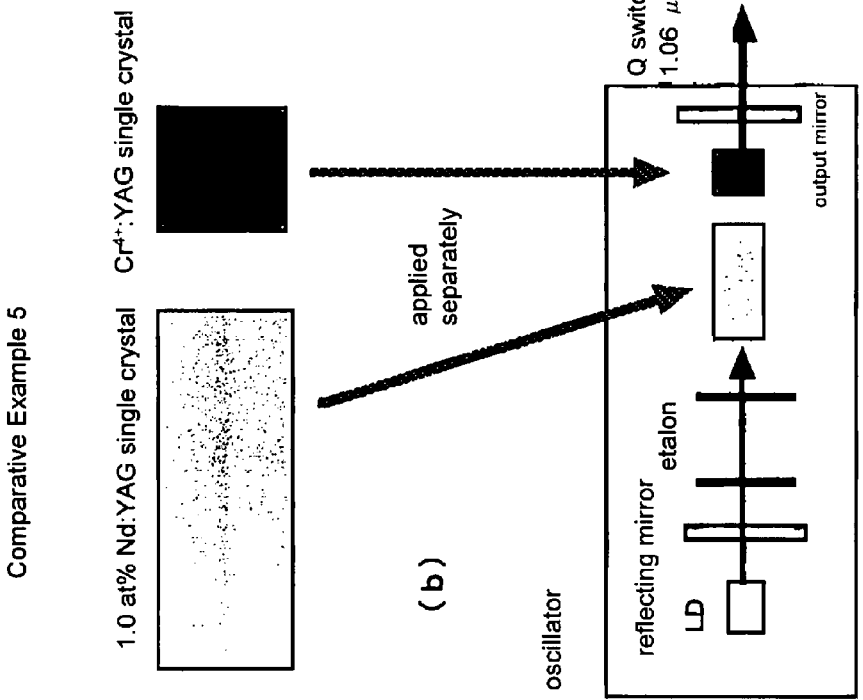
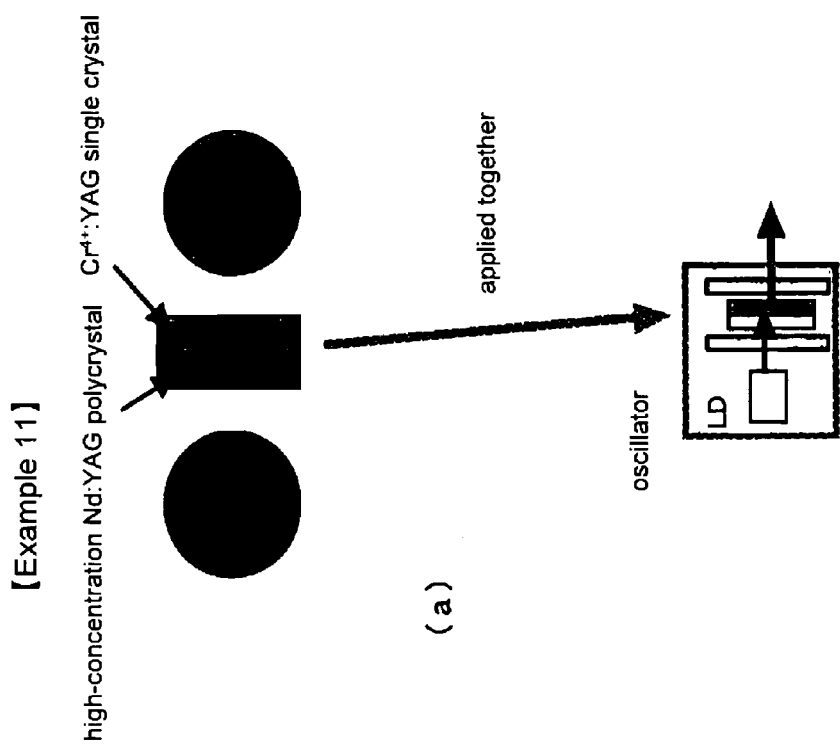

[Example 15]

【Example 16】

【Example 17】

【Example 18】

Example 23

[Example 24]

COMPOSITE LASER ELEMENT AND LASER OSCILLATOR EMPLOYING IT

FIELD OF THE INVENTION

This invention relates to a composite laser element and to a laser oscillator comprising this element.

More particularly, the invention relates to a composite laser element in which a single crystal of Nd:YAG (this refers to YAG to which neodymium has been added, expressed by the general formula $Nd_xY_{3-x}Al_5O_{12}$ (where x is the ratio in which neodymium substitutes for yttrium in a garnet structure); the same applies hereinafter), which is used as a laser oscillation element, or an Nd:YAG polycrystal or other such laser material that has been reported by the inventor and the others in recent years (see A. Ikesuke et al., Journal of American Ceramics Society, 78 (4), 1033 to 40, 1995), is bonded with the same or a different type of single crystal or polycrystal, and also relates to a laser oscillator using this composite laser element as a laser medium.

BACKGROUND OF THE INVENTION

Solid state lasers are widely used for marking, for cutting and welding steel, ceramics, and so forth, for medical laser scalpels, and so on. The application of these lasers as light sources for recording medium pick-ups has also been studied in recent years.

YAG-based materials (and especially Nd:YAG in which neodymium has been doped as an element that contributes to light emission (laser active element)) are routinely used as the medium for these solid state lasers. These materials are used in the form of single crystals manufactured by the Czochralski method (CZ method).

Methods have been proposed in which an Nd:YAG single crystal or Yb:YAG single crystal is joined with a YAG single crystal in order to achieve higher output operation than with a laser element made from an ordinary Nd:YAG single crystal (see U.S. Pat. Nos. 5,441,803, 5,852,622, and 5,846,638, for example).

In general, when the above-mentioned single crystals are joined together, this joining is carried out by cutting to a suitable size a YAG single crystal and an Nd:YAG single crystal grown by CZ method, then optically polishing the contacting faces, and heating the contacting faces (at a temperature that is 40 to 90% of the melting point, for example) under pressurization.

The above method, however, does not produce perfect matching in terms of crystal orientation between the Nd:YAG single crystals and YAG single crystals. Even if the joining faces are polished to a high precision, they will still be far from an ideal smooth surface, so it is difficult to form joining faces that are satisfactory as optical materials in a subsequent joining treatment (such as a hot pressing step).

Also, because the material strength of a YAG single crystal does not decrease very much at high temperatures, the material undergoes almost no deformation at the pressures involved in hot pressing (from a few dozen to a few hundred kilograms per square centimeter). Consequently, either just those portions of the two highly polished materials that happen to be smooth and come into contact end up being locally bonded, or gaps remain at the bonding interface according to the polishing precision.

Furthermore, with hot pressing it is impossible to manufacture a clad core type of composite laser element in which a YAG single crystal is joined to the peripheral portion of a cylindrical Nd:YAG single crystal, and particularly such an element having a structure in which the curved faces are joined. Specifically, with a clad core type, all that can be formed is a pseudo-type in which the core shape is square, rectangular, hexagonal, or the like. Furthermore, standard hot pressing involves uniaxial pressing in which a relatively high pressure is applied, and strain remains in the sample after treatment, so there are critical defects in the optical characteristics of the material that is obtained.

Meanwhile, a technique has been proposed in which the single crystals are joined together by subjecting the polished faces of a Ti:sapphire system to acid treatment and then heating to 1100° C. (see A. Sugiyama et al., "Direct bonding of Ti:sapphire laser crystal," Applied Optics, 37 (12), pp. 2047 to 10, 1998).

In case of a bonded material such as the above, however, light scattering is observed at the bonding interfaces when the interfaces are irradiated with a He—Ne laser, and in a destructive test in which a mechanical impact is applied to the bonding, a large portion of the fractured face is fractured via a smooth face (the polished face prior to joining). It can be concluded from this situation as well that the above-mentioned technique does not adequately bond the single crystals together.

When laser oscillation is performed using an element that has not been adequately bonded, during output operation at a high photon density, the operational characteristics are only a fraction of what was intended in the composite laser element design. There are also cases in which beam quality decreases or there is a dramatic drop in the service life of the element, or when the laser element is broken near the bonding face.

In particular, a tremendous amount of energy is applied during excitation with a solid state laser, but even with semiconductor laser excitation, the excitation energy drops to about half in the interior of the medium, while over 90% of the energy becomes thermal energy in the case of lamp excitation (that is, it becomes energy that does not contribute to laser emission). Thermal energy generated inside the medium is transmitted to the outside by lattice vibration of the crystals, but because bonding is inadequate with a composite laser element produced by prior art, the lattice vibration does not transmit the energy well enough, so heat builds up at this point. As a result, the element deteriorates in stages at the joint in the case of weak excitation, and impact damage occurs in the case of strong excitation, and in both cases it is difficult to maintain the intended function of the composite element.

In contrast to these single crystal bonding techniques, a solid state laser oscillator has been proposed which makes use of a composite laser medium obtained by bonding together polycrystalline transparent ceramics (see Japanese Patent Application Publication 2002-57388). More specifically, a solid state laser oscillator has been proposed which has a polycrystalline ceramic composite laser medium obtained by optically polishing the contacting face of a polycrystalline transparent ceramic containing no active element and that of a polycrystalline transparent ceramic that has been doped with an active element, and then bonding these together. According to this method, it is stated that any heat generated in the polycrystalline transparent ceramic containing the active element can be effectively dispersed by the presence of the polycrystalline transparent ceramic containing no active element.

However, the above technique has a number of problems because the bonding method itself is premised on the same bonding method as a technique such as hot pressing for bonding single crystals.

Specifically, these problems include 1) strain is produced in the interior of the one or more types of polycrystalline transparent ceramic that are bonded, 2) chipping on the side faces or internal cracking occurs, and 3) bonding face misalignment occurs between the materials during pressing. Consequently, it is difficult to obtain a good bonding state, and in this respect it is difficult to obtain a polycrystalline composite laser medium that is high in optical quality.

DISCLOSURE OF THE INVENTION

The main object of the present invention is to solve the problems encountered with the above-mentioned conventional laser media composed of a Nd:YAG single crystal or polycrystal, and to create a better bonding state, and thereby provide a composite laser element that exhibits superior performance as a laser medium.

As a result of extensive research conducted in light of the problems associated with prior art, the inventors discovered that the stated object was achieved by the following composite laser element.

Specifically, the present invention relates to the following composite laser elements, and to a laser oscillator using these elements.

Item 1. A composite laser element produced by bonding two or more crystal bodies, wherein:

(1) at least one of the crystal bodies is a transparent crystal body having a region capable of laser oscillation, and (2) the transparent crystal body and/or a second crystal body bonded with the transparent crystal body is a polycrystal.

Item 2. The composite laser element according to Item 1, wherein either the transparent crystal body or the second crystal body is a polycrystal, and the other is a single crystal.

Item 3. The composite laser element according to Item 2, wherein the bonding interface between the polycrystal and the single crystal is formed unevenly by the grains of the polycrystal.

Item 4. A method for manufacturing the composite laser element according to Item 1, comprising the steps of:

a) bringing a planar part of a transparent crystal body capable of laser oscillation into contact with a planar part of a second crystal body; and b) heating both crystal bodies at a temperature of not less than 200° C. but less than the melting point of the crystal bodies, under uniaxial pressing of 0 to 10 kg/cm$^2$ or isostatic pressure, to form a composite consisting of the crystal bodies.

Item 5. A method for manufacturing the composite laser element according to Item 1, comprising the steps of:

a) bringing a transparent crystal body capable of laser oscillation, all or part of which has a planar part whose surface roughness Ra is 0.1 nm to 150 μm, and a second crystal body, all or part of which has a planar part whose surface roughness Ra is 0.1 nm to 150 μm, into contact at their planar parts, and b) heating both crystal bodies at a temperature of not less than 200° C. but less than the melting point of the crystal bodies, under uniaxial pressing of 0 to 10 kg/cm$^2$ or isostatic pressure, to form a composite consisting of the crystal bodies.

Item 6. A method for manufacturing the composite laser element according to Item 1, comprising the steps of:

a) using a transparent crystal body capable of laser oscillation and a second crystal body, the bodies having curved surfaces of substantially the same radius of curvature, and filling the crystal bodies into a flexible capsule while maintaining a gap of 0 to 300 μm between the outer face of the curved surface of the transparent crystal body capable of laser oscillation and the inner face of the curved surface of the second crystal body, and b) subjecting both crystal bodies, along with the flexible capsule, to hot isostatic pressing at a pressure of at least 0.98 MPa and a temperature of not less than 200° C. but less than the melting point of the crystal bodies, to form a composite consisting of the crystal bodies.

Item 7. A method for manufacturing the composite laser element according to Item 1, comprising the steps of:

a) bringing a powder compact of a powder composition that can constitute a transparent crystal body capable of laser oscillation into contact with a powder compact of a powder composition that can constitute a second crystal body, and b) heating both powder compacts at a temperature that is 70 to 95% of the melting points of the two powder compacts, to form a composite consisting of the crystal bodies.

Item 8. The manufacturing method according to any of Items 4 to 6, wherein:

(1) a single crystal is used for one of the crystal bodies, and a polycrystal is used for the other, and (2) all or part of the polycrystal is grown through the single crystal.

Item 9. The manufacturing method according to any of Items 4 to 6, wherein:

(1) a single crystal is used for one of the crystal bodies, and a polycrystal is used for the other, and (2) absorbing the grains of the polycrystal into the single crystal and thereby obtaining the bonding interface between the polycrystal and the single crystal formed unevenly by the grains of the polycrystal.

Item 10. A laser oscillator comprising the composite laser element according to any of Items 1 to 3.

ADVANTAGES OF THE INVENTION

Because the composite laser element of the present invention exhibits a better bonding state, the composite laser element function can be realized to its full potential. Furthermore, it is possible to compound with AlN or another such ceramic with high thermal conductivity, or with platinum, tungsten, or another such metal material, and this should lead to the development of super-compact, high-output solid state lasers.

Because the core shape can be cylindrical with a clad core type (made of a material containing active ions only in the center part of the laser element), there is much greater latitude in material design, such as greater ease of fiber mode formation, and more uniform heat dissipation (that is, better beam quality), and this leads to markedly better element function.

The manufacturing method of the present invention involves relatively simple manufacturing steps, and is therefore advantageous from the standpoint of cost. In contrast, with an ordinary manufacturing method based mainly on hot pressing, anything other than uniaxial joining is fundamentally impossible, so the number of treatments increases in proportion to the number of axes, and this correspondingly drives up the manufacturing cost.

Also, in regard to productivity, no more than one element per batch could be obtained with prior art, but one of the advantages to the manufacturing method of the present invention (and particularly the above-mentioned method involving a capsule treatment[2]) is that several dozen or more composite laser elements can be manufactured in a single batch. Therefore, the present invention is superior to existing art in terms of both laser performance and cost.

BRIEF DESCRIPTION OF THE DRAWINGS

FIG. 2 is a step diagram illustrating an example of the manufacturing method of the present invention;

FIG. 3 is a schematic diagram (side view and cross section) illustrating the structure of the composite laser element of the present invention;

FIG. 4 is a schematic diagram illustrating the joining state with prior art ((a) and top drawing in (b)) and the present invention (bottom drawing in (b));

FIG. 5 is a schematic diagram (side view and cross section) illustrating the structure of the composite laser element of the present invention;

FIG. 6 is a schematic diagram illustrating the state of interfacial movement in the bonded portion in the present invention;

FIG. 11 is a simplified diagram illustrating the structure of oscillators featuring the laser elements of Example 11 (FIG. 11a) and Comparative Example 5 (FIG. 11b);

BEST MODE FOR CARRYING OUT THE INVENTION

Figure 1:
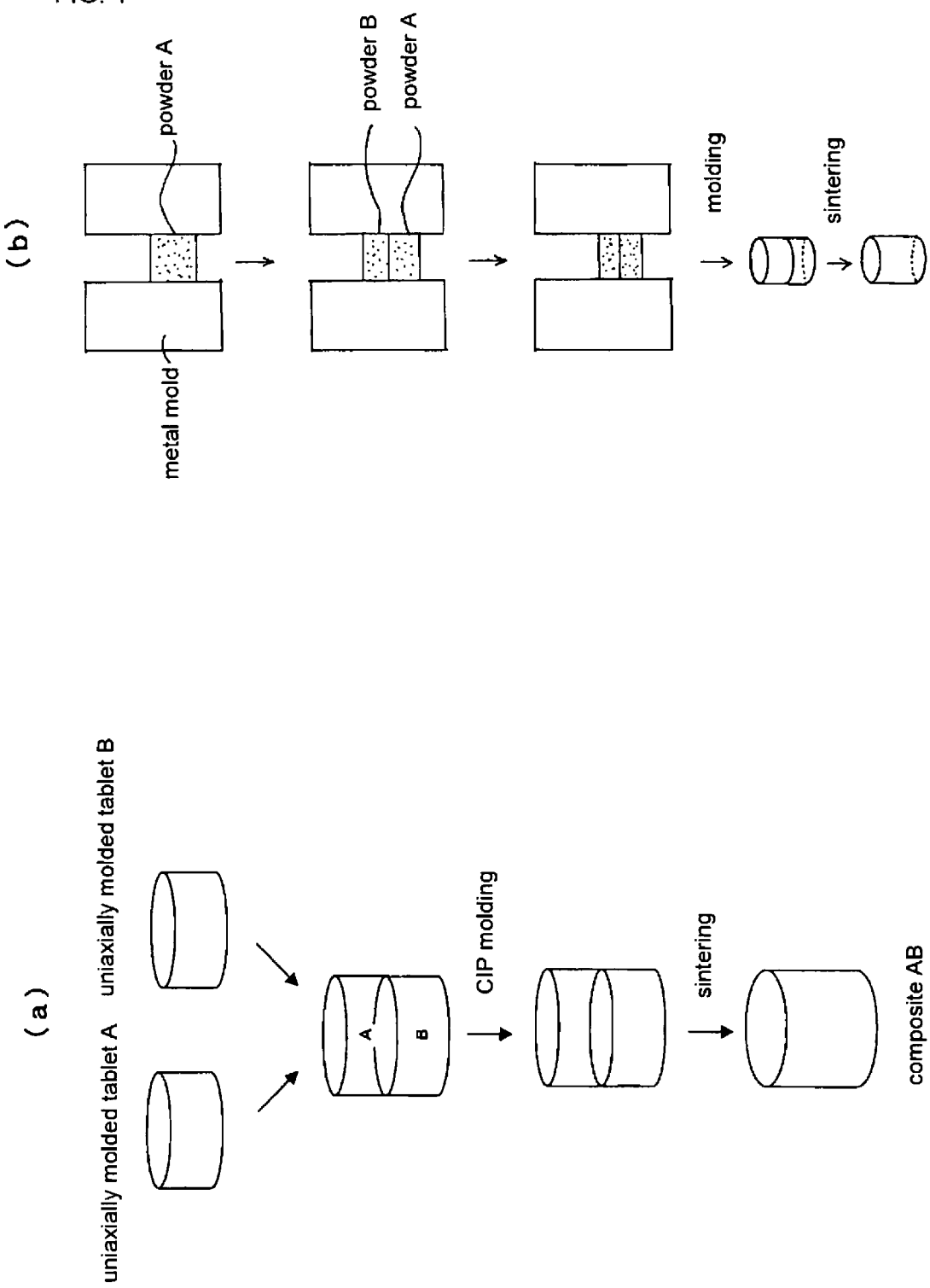
FIG. 1 is a step diagram illustrating an example of the manufacturing method of the present invention.

Composite Laser Element of the Present Invention

The composite laser element of the present invention is a composite laser element produced by bonding two or more crystal bodies, wherein:

(1) at least one of the crystal bodies is a transparent crystal body having a region capable of laser oscillation, and (2) the transparent crystal body and/or a second crystal body bonded with the transparent crystal body is a polycrystal.

The oscillation body contains one or more laser active elements in a matrix crystal. There are no restrictions on the matrix crystal, but an oxide, fluoride, or the like can be used favorably. Examples include $Y_3Al_5O_{12}$ (YAG), $Gd_3Ga_5O_{12}$ (GGG), $Ga_3Sc_2Al_3O_{12}$, and other such oxides having a garnet structure; $Sc_2O_3$, $Y_2O_3$, $Gd_2O_3$, $Lu_2O_3$, and other such oxides of rare earth elements; $YVO_4$, $GdVO_4$, and other such vanadate oxides; sapphire ($Al_2O_3$), alexandrite ($BeAl_2O_4$), and other such aluminum oxides; forsterite ($Mg_2SiO_4$) and other such magnesium oxides; $LiSrAlF_6$, $LaCaAlF_6$, and other such fluorides; and $ReAl_3(BO_3)_4$ (Re: rare earth element) and other such boron oxides. These can be used singly or in combinations of two or more.

The laser active element can be any one that has been known in the past as a fluorescent element or light emitting element. For example, at least one of titanium, chromium, and lanthanoid elements ($_{57}Lu$ to $_{71}Lu$) can be used favorably.

The amount in which the laser active element is contained in the matrix crystal may be an amount large enough for laser oscillation, and usually about 0.05 to 50 at % is preferable. Within this range, the amount can be set as needed according to the desired performance, the type of laser active element being used, and so forth.

The second crystal body bonded with the above-mentioned oscillation body may or may not contain a laser active element. This can be suitably decided as dictated by the intended application of the finished product, how it will be used, and so forth. Therefore, the present invention comprises both the bonding of an oscillation body and a crystal body containing a laser active element (that is, bonding oscillation bodys together), and the bonding of an oscillation body and a crystal body that does not contain a laser active element.

Besides the matrices listed above, examples of the second crystal body include various oxides, nitrides, carbides, carbon materials, metals, and so forth. More specific examples include BeO, Mgo, and other such oxides; $Si_3N_4$, AlN, Bn, TiN, and other such nitrides; $B_4C$, SiC, and other such carbides; carbon, diamond, and other such carbon materials; and W, Mo, Pt, Au, Al, Cu, and other such metals, and alloys containing one or more of these.

With the laser element of the present invention, the oscillation body and/or the second crystal body includes a polycrystal body. Specifically, at least one of the following combinations is included: polycrystal (oscillation body)-polycrystal (second crystal body), single crystal (oscillation body)-polycrystal (second crystal body), and polycrystal (oscillation body)-single crystal (second crystal body). Of these combinations, one in which all or part of the second crystal body is a polycrystal is preferable, although this depends on the laser element structure. Also, as long as one of the above combinations is used, a combination of single crystal and single crystal may be present partially.

The second crystal body may be a transparent crystal material or an opaque crystal material, which may be suitably selected as dictated by the intended application of the finished product, how it will be used, and so forth. For example, an intersecting type of composite laser element (discussed below) requires the use of a transparent crystal. An opaque crystal may be used with a non-intersecting type of composite laser element (discussed below).

With the present invention, the second crystal body preferably has a coefficient of thermal expansion that is within ±50%, and even more preferably within ±20%, and especially preferably within ±10%, of the coefficient of thermal expansion of the oscillation body. Setting the coefficient to this numerical range makes it possible to maintain a bonding state with less strain. This numerical value may be suitably determined according to the surface area of the joint (with a bonding having a relatively large surface area, for example, the coefficients of thermal expansion of the crystal body capable of laser oscillation and the second crystal body should be as close together as possible), the bonding configuration (and particularly whether or not the bonding intersects with the laser emission direction), and the difference in the modulus of elasticity between the crystal body capable of laser oscillation and the second crystal body (for example, if the second crystal body is a metal or other material that is softer than the crystal body capable of laser oscillation, the difference in the coefficients of thermal expansion may be relatively large, and in the opposite case, the coefficients of thermal expansion are selected to be as close together as possible).

With the present invention, if the second crystal body contains no laser active element and is intended to cool the laser medium, the second crystal body preferably has a thermal conductivity that is the same as or greater than the thermal conductivity of the oscillation body. Selecting a second crystal body such as this allows the heat generated during laser generation to be removed more efficiently. It is particularly favorable for the thermal conductivity of the second crystal body to be at least 1 W/mk, and preferably at least 5 W/mk, higher than that of the oscillation body.

The second crystal body is bonded with the oscillation body in the laser element of the present invention. With the present invention, it is preferable for all or part of the oscillation body to be bonded with one or more second crystal bodies.

With the present invention, a composite laser element in which the second crystal body is a tube (a tubular body in which the core of a cylindrical second crystal body is hollow) and the inside of the tube is made up of the oscillation body can be used to particular advantage. Put another way, an example of a preferred aspect is a composite laser element in which the oscillation body is cylindrical, the second crystal body is tubular, the side face of the cylinder is bonded with the inner face of the tube, and the oscillation body forms the core. In this case, the diameter of the core is preferably at least 0.3 mm, and particularly at least 0.5 mm, from the standpoints of productivity and mechanical strength.

The compositions or crystal structures of the oscillation body and the second crystal body may be the same or different from each other. In particular, if the crystal structures and compositions of the oscillation body and the second crystal body are the same, or if the crystal structures are the same and the compositions are similar, this is advantageous when crystal bodies are connected in a long series, or when a laser element having a large surface area is produced.

In particular, with the present invention, if the compositions and/or the crystal structures are different from each other, the present invention also encompasses a structure in which a reaction phase is present at the bonding between the two bodies. If a reaction phase (reaction layer) is present, its thickness is preferably 100 μm or less. If the crystal structures are both the same, the present invention also comprises a structure in which crystal growth proceeds from the single crystal toward the polycrystal at the contacting face.

With the laser element of the present invention, a substance capable of saturated absorption at the oscillation wavelength may be present at or near the bonding interface between the oscillation body and the second crystal body. For example, when Nd:YAG is used for the oscillation body, functions such as preventing parasitic oscillation during strong excitation can be obtained if $Cr^{4+}$:YAG is disposed around this Nd:YAG (particularly on a flat or curved surface that is parallel to the laser emission direction).

Also, when the contacting face between the oscillation body and the second crystal body are flat and are disposed intersecting with the laser emission direction, interference fringes are preferably formed at the transmission wavefront of an interferometer, and it is particularly favorable for the number of interference fringes to be 2 or less (within $2\lambda$ with respect to the measured wavelength (generally $\lambda$=633 nm)), and preferably no more than 1 ($\lambda$). This restriction ensures a better bonding state.

Figure 23:
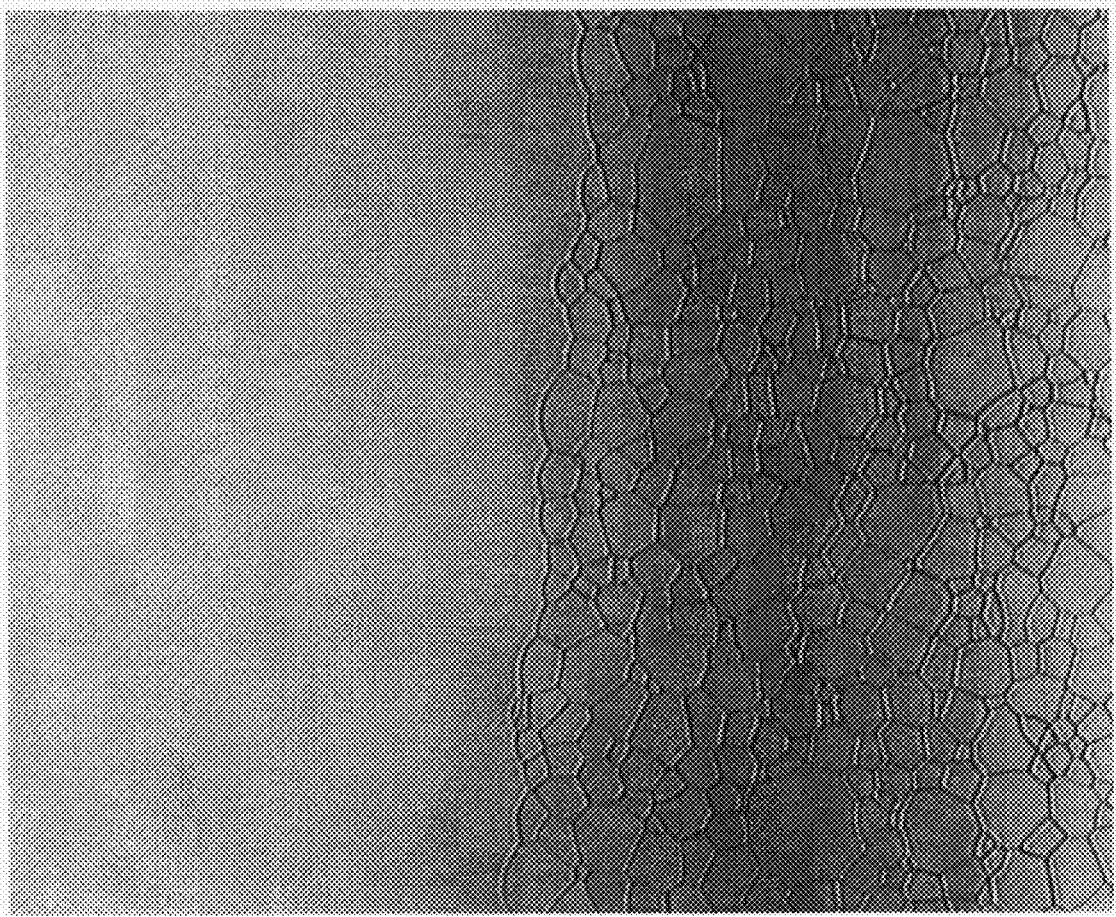
FIG. 23 is a simulation of the result of observing the bonding state (polycrystal-single crystal interface) of the composite laser element of the present invention.
Figure 24:
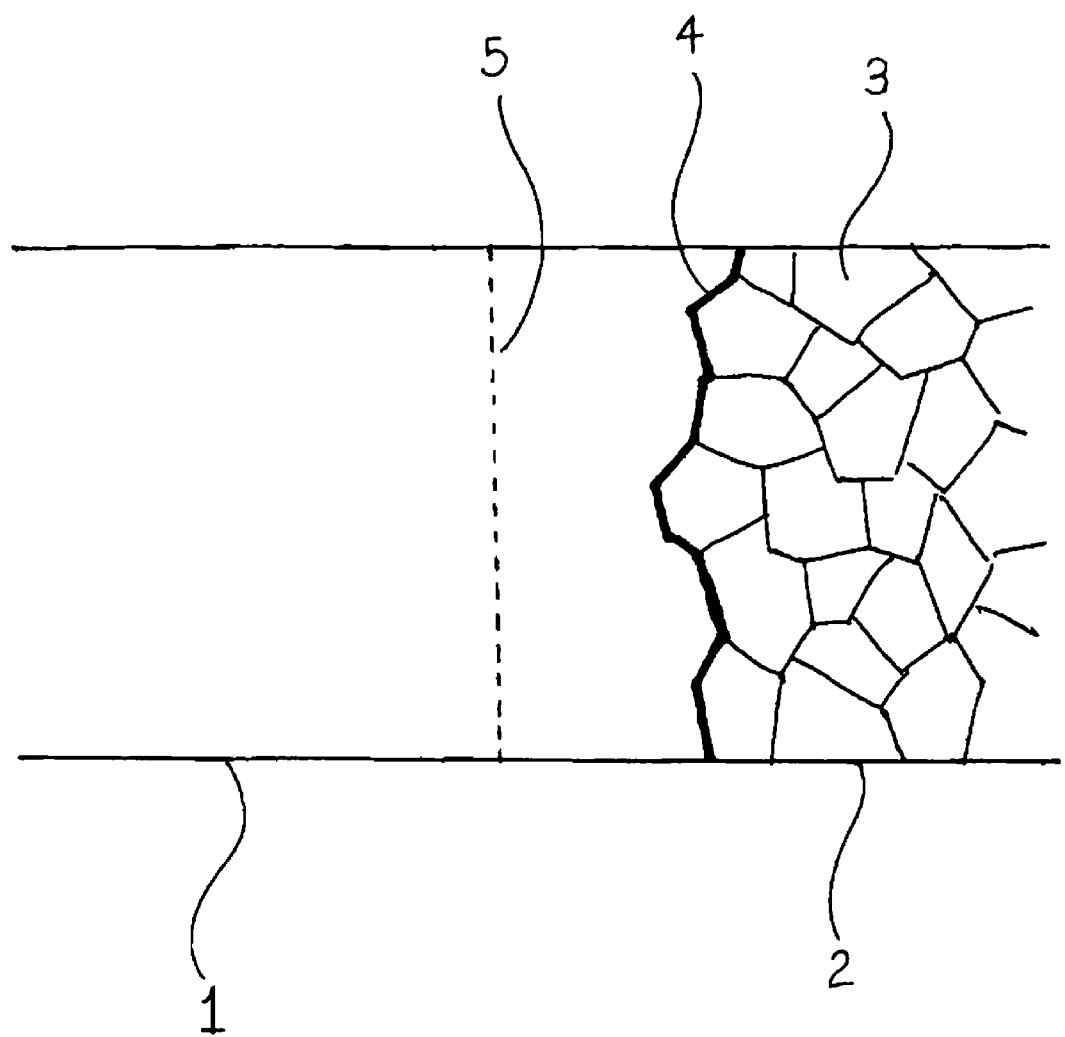
FIG. 24 is a schematic diagram illustrating the bonding state (polycrystal-single crystal interface) of the composite laser element of the present invention.

In the bonding of the laser element of the present invention, and particularly in the bonding of a polycrystal to a single crystal, it is preferable if the bonding interface is formed unevenly by the crystal grains of the polycrystal. FIG. 23 is a simulation of the result of observing the bonding state of the present invention. FIG. 24 is a schematic diagram illustrating this bonding state. As shown in FIG. 24, unevenness resulting from the crystal grains 3 of a polycrystal 2 are formed in a single crystal 1 at the bonding interface 4 of the single crystal and the polycrystal. This bonding state is stronger than that of conventional bonded materials, so better laser characteristics can be obtained. With the manufacturing method of the present invention, the single crystal 1 and the polycrystal 2 are brought into contact, and then the crystal grains of the polycrystal are absorbed into (merged with) the single crystal in the course of heat treatment, which eliminates any voids present at the time the bodies were brought into contact, and the bonding interface 4 on the single crystal side is formed unevenly by the crystal grains 3 of the polycrystal. In other words, the bonding interface 4 is formed in an uneven shape on the polycrystal 2 side from the initial polycrystal-single crystal contact face 5. This uneven face in the range of the grain size is not formed in single crystal-polycrystal joining that does not entail crystal growth, or conventional single crystal-polycrystal bonding.

Method for Manufacturing Composite Laser Element

The composite laser element of the present invention can be efficiently manufactured by any of the first to third methods discussed above. The first to third methods will be described in specific terms below.

(1) First Method

The first method is a method for manufacturing the composite laser element according to claim 1, comprising the steps of:

a) bringing a planar part of a transparent crystal body capable of laser oscillation into contact with a planar part of a second crystal body; and b) heating both crystal bodies at a temperature of not less than 200° C. but less than the melting point of the crystal bodies, under uniaxial pressing of 0 to 10 kg/cm$^2$ or isostatic pressure, to form a composite consisting of the crystal bodies. (Hereinafter referred to as the "first method.")

The first method comprises a method for manufacturing the composite laser element according to claim 1, comprising the steps of:

a) bringing a transparent crystal body capable of laser oscillation, all or part of which has a planar part whose surface roughness Ra is 0.1 nm to 150 μm, and a second crystal body, all or part of which has a planar part whose surface roughness Ra is 0.1 nm to 150 μm, into contact at their planar parts, and b) heating both crystal bodies at a temperature of not less than 200° C. but less than the melting point of the crystal bodies, under uniaxial pressing of 0 to 10 kg/cm$^2$ or isostatic pressure, to form a composite consisting of the crystal bodies.

With the first method, at least an oscillation body and a second crystal body are prepared. These can be manufactured by any known method. If either of these is a single crystal, then it can be one obtained by a known single crystal production method, such as a Bridgeman method, CZ (Czochralski) method, or Bernoulli method. If either is a polycrystal, it can be a ceramic manufactured by a known method. Also, with the present invention, a thin film (polycrystal) produced by a PVD method, typified by ion beam method, sputtering, ion plating, and so forth, or a CVD method, typified by MOCVD, plasma CVD, and so forth, can also be used as the oscillation body or second crystal body of the present invention.

In step a) above, there are no particular restrictions on the surface roughness of the contact face between the oscillation body and the second crystal body, and it can be suitably adjusted according to the laser performance, application, and so forth. In particular, if the laser intersects the bonding interface, it is preferable for a transparent crystal material capable of laser oscillation, all or part of which has a face whose surface roughness Ra is 0.1 nm to 150 μm, and a second crystal body, all or part of which has a face whose surface roughness Ra is 0.1 nm to 150 μm, to be brought into contact at the faces.

The surface roughness of the oscillation body and second crystal body in this case is to be such that the surface roughness Ra of all or part of both is from 0.1 nm to 150 μm, and may be suitably selected from the above range as dictated by the intended application of the finished product, how it will be used, and so forth. For instance, if there is bonding that intersects with laser emission, Ra is preferably from 0.1 to 5.0 nm (a face adjusted to this surface roughness is referred to as a "smooth face"; the same applies hereinafter). A more favorable bonding state can be obtained by forming a flat face of λ (λ=633 nm), and preferably λ/2 or less. With the present invention, these smooth faces are brought into contact and bonded, the result of which is that a better bonding can be obtained. With the present invention, the above-mentioned surface roughness indicates the value measured according to JIS B 0601. This surface roughness can be controlled by a known method (such as polishing).

In step b) above, the two crystal bodies are bonded by heating the crystal bodies at a temperature that is at least 200° C. and is under the melting point of the crystal bodies, under uniaxial pressing of 0 to 10 kg/cm$^2$ or isostatic pressure.

If the bonding is performed under isostatic pressure, there are no particular restrictions on the load thereof. Any known method for pressurization by isostatic pressure can be employed, but HIP (hot isostatic pressing) is preferable.

On the other hand, if the bonding is performed under uniaxial pressing, the pressure is from 0 to 10 kg/cm$^2$ (preferably 0 to 5 kg/cm$^2$). Among pressing methods involving uniaxial pressing, a method in which the oscillation body's and the second crystal body's own weight, or the weight of a metal or other suitable material, is applied is favorable in that more uniform bonding can be achieved.

The heating may be performed at a temperature that allows the two crystal bodies to be favorably bonded, and ranges from at least 200° C. to under the melting point of the crystal body (preferably at least 200° C. and no more than 95% of the melting point). The term "melting point" as used in the present invention is the melting point of the joined crystal bodies, and when mutually different crystal bodies are bonded, then this is based on the melting point of whichever crystal body has the lowest melting point. The heating atmosphere and duration can be suitably set according to the type of crystal bodies to be bonded, the heating temperature, the pressure, and so forth.

The crystal bodies (single crystal and polycrystal) used in the present invention can be produced by any known method. Commercially available single crystals and polycrystals can also be used without modification. In addition to a melt-growth method typified by the above-mentioned CZ method, a known sintering method or the like can be applied as the method for manufacturing a single crystal. Sintering, vapor deposition, or another such known method can be applied as the method for manufacturing a polycrystal.

In the first method, when a polycrystal and a single crystal are used as the crystal bodies to be bonded, the crystal grains of the polycrystal are preferably absorbed into the single crystal, so that the bonding interface between the polycrystal and single crystal is formed unevenly by the grains of the polycrystal. This produces the resultant composite shown in FIGS. 22 and 23. The absorption of the crystal grains of the polycrystal into the single crystal can be accomplished by suitably varying the above-mentioned conditions (and particularly step b) of the first method) as dictated by the type of crystal bodies being used, the crystal grain size, and so forth.

(2) Second Method

The second method is a method for manufacturing the composite laser element of the present invention, comprising the steps of:

a) bringing a powder compact of a powder composition that can constitute a transparent crystal body capable of laser oscillation into contact with a powder compact of a powder composition that can constitute a second crystal body, and b) heating both powder compacts at a temperature that is 70 to 95% of the melting points of the two powder compacts, to form a composite consisting of the crystal bodies.

The second method allows two types of joined materials to be produced, in which the contacting face is either flat or curved.

In step a) above, a powder compact of a powder composition that can constitute a transparent crystal material is brought into contact with a powder compact of a powder composition that can constitute the second crystal body.

This step comprises 1) a method in which each powder compact is manufactured in advance, and the two powder compacts are then brought into contact, as well as 2) a method in which just one of the powder compacts is produced, this powder compact is put into a vessel or the like, and the other powder composition is packed into the voids between this powder compact and the vessel, and pressed.

The powder compact of a powder composition for a transparent crystal body can be a powder compact obtained from a powder composition having the composition of the above-mentioned oscillation body. The powder compact of a powder composition for a second crystal body can be a powder compact obtained from a powder composition having the composition of the above-mentioned second crystal body. An advantage to the second method is that the desired laser element structure of crystal structure can be obtained without a polishing step, or an intricate bonding face can be formed. It is alright if the powder compact having a powder composition for a transparent crystal body has a different composition from the powder compact having a powder composition for a second crystal body, but it is preferable for the crystal structures after sintering to be the same.

The powder compositions can each be manufactured by a known method. For example, they may be prepared by co-deposition, an alkoxide method, or a solid phase method that makes use of an oxide (powder) of the constituent elements, or the like. There are no particular restrictions on the particle size of the powder compositions, but an average particle size of 1 μm or less is generally preferable.

Each powder compact can be manufactured by a known molding method. For instance, uniaxial press molding, extrusion molding, a CIP method, or the like can be applied.

When flat surfaces are to be brought into contact (joined), this may be accomplished as shown in FIG. 1, for example. Specifically, as shown in FIG. 1a, a composite powder compact comprising integrated tablets A and B can be produced by stacking uniaxially molded tablets A and B as shown in the drawing and performing CIP molding in this state. Alternatively, as shown in FIG. 1b, a composite powder compact comprising integrated tablets A and B is produced by lightly pressing a powder A in a metal mold, then putting in a powder B from above, molding at a pressure of at least the pressure used during the molding of the powder A, and taking this product out of the mold. The composite powder compact thus obtained can be fired immediately, or first subjected to CIP molding to raise the density of the molded article, and then fired.

When curved surfaces are to be brought into contact (joined), this may be accomplished as shown in FIG. 2, for example. Specifically, as shown in FIG. 2a, a composite powder compact having a tablet A as its nucleus (having a structure in which the entire surface of A is covered by B) can be obtained by first producing a small table A, embedding this tablet A in a powder B that is molded in a metal mold larger than A, and uniaxially molding tablets A at a pressure of at least the pressure during the molding of the powder compact A. In this case, contact between A and B occurs over both flat and curved surfaces. Also, as shown in FIG. 2b, a powder compact tablet A is produced in a relatively long and slender cylindrical form, while a powder compact tablet B is produced in a ring shape (doughnut shape or hollow shape) having an internal space that is substantially the same height as A and has substantially the same inside diameter as the outside diameter of A. Tablet A is then inserted (filled) in tablet B and CIP molding is performed, which gives a composite powder compact in which A and B are in contact substantially only at curved surfaces. These composite powder compacts may be subjected to ordinary firing.

In step b) above, the two powder compacts are heated at a temperature that is 70 to 95% (and preferably 80 to 95%) of the melting point, to bond a transparent crystal material capable of laser oscillation with a second crystal body. The heating conditions here may be the same as those in the first method discussed above.

In this sintering step, pressure may or may not be applied to the powder compacts. Also, the powder compacts may be joined at normal pressure or under a vacuum. If pressure is applied, the powder compacts may be encapsulated and then pressed and sintered, but in terms of production efficiency and so forth, it is preferable to use a capsule-free method because this eliminates the extra time and cost entailed by encapsulation, which is accomplished by first adjusting the relative density of the composite ceramic (composite powder compacts) to at least 90%, and preferably 93 to 99.9%. The pressure range is not restricted, but in the case of HIP, it is usually at least 100 kg/cm$^2$, with 500 kg/cm$^2$ or higher being especially favorable. Whether or not pressing is appropriate may be suitably determined according to the intended application of the finished product, the desired productivity, and so forth.

With the second method, the difference in the firing shrinkage between the two powder compacts is preferably set to no more than 4%, and even more preferably 3% or less. Setting the difference to 4% or less more effectively reduces or prevents defects (cracks, residual bubbles, strain, etc.) near the bonding interface of the composite laser element that is obtained after sintering. The firing shrinkage can be controlled, for example, by a method in which the same main raw material (with a commercially available product, the same brand name, for example) is used for the powder compacts, or a method in which the density (packing ratio of powder compacts) or the like is adjusted.

(3) Third Method

The third method is a method for manufacturing the composite laser element according to claim 1, comprising the steps of:

a) using a transparent crystal body capable of laser oscillation and a second crystal body, the bodies having curved surfaces of substantially the same radius of curvature, and filling the crystal bodies into a flexible capsule while maintaining a gap of 0 to 300 μm between the outer face of the curved surface of the transparent crystal body capable of laser oscillation and the inner face of the curved surface of the second crystal body, and b) subjecting both crystal bodies, along with the flexible capsule, to hot isostatic pressing at a pressure of at least 0.98 MPa and a temperature of not less than 200° C. but less than the melting point of the crystal bodies, to form a composite consisting of the crystal bodies.

In step a) above, a transparent crystal body capable of laser oscillation and a second crystal body having curved surfaces of substantially the same radius of curvature are used, and these are disposed in a flexible capsule while maintaining a gap of 0 to 300 μm between the outer face of the curved surface of the transparent crystal body capable of laser oscillation and the inner face of the curved surface of the second crystal body.

With the third method, an oscillation body and a second crystal body which have substantially the same radius of curvature are prepared. The outer face of the oscillation body curved surface and the inner face of the second crystal body curved surface are put together. The radius of curvature is preferably a perfect match, but need only be substantially the same.

The gap between the two faces is from 0 to 300 μm (and preferably from 0 to 50 μm). To put this the opposite way, as long as the gap between the two falls within the above range, the radii of curvature of the two curved surfaces may be slightly different.

The two crystal bodies are put into a flexible capsule while disposed in the above state. There are no particular restrictions on the flexible capsule as long as it will deform (be plastic) under the heating involved in the present invention. It is particular desirable for the above-mentioned capsule to be made of metal, but any inorganic material that can be softened while hot (such as quartz or glass) can also be used. Examples include platinum, copper, iron, tantalum, and other such metals. A flexible capsule composed of a metal foil with a thickness of about 1 mm or less can be used favorably as this metal flexible capsule.

In step b) above, the two crystal bodies are bonded, along with the flexible capsule, by subjecting them to hot isostatic pressing at a pressure of at least 10 kg/cm² and at a temperature that is at least 200° C. and is under the melting point.

In this step, the two crystal bodies are bonded by being pressed along with the flexible capsule. Any known method can be applied for the hot isotropic pressing. The heating temperature may be the same as in the first method. The pressure may be suitably determined within a range of 10 kg/cm² and higher.

With the third method, if a polycrystal and a single crystal are used as the crystal bodies to be bonded, it is preferable if the unevenness face as the bonding interface between the polycrystal and single crystal is formed by the grains of the polycrystal in the course of heat treatment. This produces the composite shown in FIGS. 23 and 24. The absorption of the crystal grains of the polycrystal into the single crystal can be accomplished by suitably varying the above-mentioned conditions (and particularly step b) of the third method) as dictated by the type of crystal bodies being used, the crystal grain size, and so forth.

Laser Oscillator

The composite laser element of the present invention as the laser medium is used in the laser oscillator of the present invention. As the various constituent elements (excitation lamps, filters (etalons), output mirrors (half-mirrors), and so forth with the exception of the composite laser element, the various elements that have been employed in known laser oscillators can be used in the present invention.

There are no restrictions on the number of composite laser elements installed, the installation locations, and so on, and these can be suitably set as dictated by the intended purpose of the laser oscillator, the application, the desired performance, and so forth.

Embodiments of the Composite Laser Element of the Present Invention

An intersecting type of composite laser element featuring a Nd:YAG single crystal and a YAG polycrystal will now be described as an example of the present invention through reference to the drawings.

FIG. 3 shows a composite laser element having a structure in which a plate-shaped Nd:YAG single crystal are sandwiched between YAG polycrystals.

First, the Nd:YAG single crystal and the YAG polycrystals are cut to the appropriate size, and the contacting faces of each are preferably optically polished. The contacting faces of both the Nd:YAG single crystal and the YAG polycrystals are preferably polished ahead of time so that their flatness is $2\lambda$ ($\lambda=633$ nm) or less, and preferably $\lambda/2$ or less, and their surface roughness Ra is about 0.1 to 5 nm. When polished faces of the Nd:YAG single crystal and YAG polycrystals are brought into contact, in the case of a YAG-based material, it may be bonded by heating at a temperature that is at least 1200° C. and under the melting point, and applying the weight of these crystals or another metal or the like in one direction.

FIG. 4a is a simulation of a conventional joining (diffusion bonding) state when a Nd:YAG single crystal and a YAG single crystal are optically polished and the two polished faces are brought into contact, after which a heat treatment (hot pressing or other such pressing is also possible) is performed at a relatively high temperature. Even though a Nd:YAG single crystal or YAG single crystal is optically polished, the polished face is still not in an ideal state, and there are sub-$\lambda$ (visible wavelength) undulations, or surface roughness on the nano-level within these undulations. Consequently, when the two crystals are brought into contact and heat treated, as shown in FIG. 4a, bonding only occurs near the portions of contact, which depends on the state of polishing. A laser material such as YAG is a eutectic crystal, so the single crystals themselves will not deform at high temperature, and basically inter-diffusion occurs in the course of heat treatment at the portions where the two are in contact, so partial bonding results.

FIG. 4b is a simulation in which the bonding state of the present invention is compared to that of prior art. The upper diagram is prior art, and the lower is the present invention, and the gaps produced by existing polishing technology, with which an ideal state cannot be achieved, are exaggerated in the drawing. As shown in FIG. 4b, with the bonding of the present invention, grain boundary slip occurs between the grains that make up the polycrystal, and the unevenness (gaps) of the contacting faces produced by polishing can be filled in by the flexibility of the material. Accordingly, with the present invention, a bonding state that is superior to that of prior art can be achieved by using a polycrystal for at least one of the crystal materials to be bonded, and joining at a specific pressure (specifically, a pressure about equal to the weight of the crystal materials).

FIG. 5 shows a cylindrical clad-core type of composite laser element. An element having this structure cannot be produced by prior art, as mentioned above. In contrast, as also mentioned above, such an element can indeed be produced with the manufacturing method of the present invention.

First, a Nd:YAG single crystal (core) that has been formed into cylindrical shape, and a YAG polycrystal (clad) whose core portion has been bored out are prepared. The outer peripheral portion (curved surface) of the Nd:YAG single crystal serving as the core is mirror-polished, and the inner face of the YAG polycrystal serving as the clad is similarly mirror-polished. The clearance between the core and the clad is no more than 300 μm, with 50 μm or less being particularly favorable. With the core inserted in the clad, both are covered with a capsule composed of Ta, Pt, or other such metal foil (the capsule is preferably sealed by fusing shut the opening after the materials have been put in). This material is subjected to HIP treatment at a temperature of at least 1200° C. (and preferably from 1300 to 1800° C.) and a pressure of 100 to 5000 kg/cm², which gives a clad element having a circular core, with the two bonded well. With the present invention, conventional clad-core laser elements with a pseudo-circular shape, such as square, rectangular, hexagonal, and other such shapes, can also be produced by a single HIP treatment. In contrast, with prior art, if the core is square, this requires a complicated process in which the clad and core are first bonded in the vertical direction by heat treating while pressing vertically on the clad, and then bonding by the same means in the nonbonded horizontal direction. Naturally, such a structure can also be produced with the present invention.

The bonding state depends on the conditions under which the composite laser element is used, but if the contacting face is flat (and particularly if it is an intersecting type), the number of interference fringes is preferably 2 ($2\lambda$) or less, and even more preferably 1/2 ($\lambda/2$), and Ra is preferably from 0.1 nm to 5 nm. When YAG single crystal is applied to both sides of a Nd:YAG polycrystal with a diameter of 50 mm and a thickness of about 5 mm with the intent of producing a high-output disk laser, the bonding interface area is relatively large (approximately 20 cm²). Accordingly, bonding or joining is preferably performed over at least 80%, and particularly at least 90%, of the contact surface area in the center portion. Bonding over a large area in this way can be favorably accomplished by an HIP process in which pressure is applied uniformly. Disturbance of the true interference fringes that occurs as a result of bonding can be measured from the difference between the disturbance of the wavefront originating in the material itself and the disturbance of the wavefront after bonding, with the single crystal and polycrystal that are used both being polished flat and parallel ahead of time.

The clad of the composite laser element in FIG. 5 can be formed from a nitride, carbide, or the like, or from a metal. Metallic platinum, for example, has a coefficient of thermal expansion of about 8 to $9 \times 10^{-6}$. This is close to the $8 \times 10^{-6}$ value of YAG. The thermal conductivity of metallic platinum is about 70 W/mk, which is about 7 times that of YAG. Because of this, when the laser medium is a YAG crystal, it is possible to obtain a structure with superior heat dissipation by disposing platinum or another material with excellent thermal conductivity as the clad. When a Nd:YAG single crystal is bonded with platinum, this bonding is preferably performed by using a cylindrical Nd:YAG single crystal as the core, readying platinum clad that is hollow in the center, and bringing the two into contact at a clearance of 300 μm or less. If the clad is a metal, the outer periphery of the core and the inner periphery of the clad may be polished. Metal lends itself extremely well to deformation, and bonding strength can be increased by increasing the contact surface area with the Nd:YAG single crystal and using an interlocking structure (a structure in which parts of the surfaces of the metal and the Nd:YAG single bite into each other). Therefore, an even better bonding state can be obtained by roughening the Nd:YAG surface to a surface roughness of about 150 μm or less and/or machining numerous fine grooves around the outer periphery of the Nd:YAG single crystal. Also in this case, the core is inserted into the clad, the obtained clad-core is put into a capsule made of a platinum, tantalum, or the like, and then HIP treatment may be performed. Here again, adequate bonding can be accomplished at a relatively low treatment temperature of about 200 to 1000° C. If a metal with high thermal conductivity is disposed around the laser medium, heat dissipation inside the laser medium will be extremely good, and the problems of decreasing beam quality and decreased output due to a thermal lens effect will be greatly ameliorated. Since there is the risk of parasitic oscillation at higher outputs, a material that will bring about optical absorption in the 1 μm band is preferably present between the platinum and the Nd:YAG single crystal. A typical example of this material is $Cr^{4+}$:YAG. For instance, a parasitic oscillation prevention layer can be formed by baking $Cr^{4+}$:YAG particles onto the medium surface or forming a $Cr^{4+}$:YAG film on the medium surface by laser ablation, an alkoxide method, sputtering, or the like. The same objective can also be achieved by forming a YAG layer containing $Cu^{2+}$ ions, forming a thin glass layer, forming a thick film of $Sm^{3+}$:YAG by LPE (liquid phase epitaxy), or another such method.

The radius of curvature of the core in the present invention is preferably at least 0.3 mm, that is, the lower limit to the core diameter is 0.6 mm. A single crystal whose core diameter is within this range can be easily obtained by machining a single crystal grown by an ordinary CZ method.

In particular, in case of bonding a polycrystal with a single crystal, which have the same type of crystal structure and having the same or different compositions, it is preferable if the individual grains of polycrystal that come into contact with the single crystal are absorbed into the single crystal, so that the bonding interface is moved. FIG. 6 is a schematic diagram of this mechanism (the upper drawing is after the bonding treatment, and the lower drawing is in the course of going from the bonding treatment to the heat treatment). At the contacting face between the single crystal and polycrystal, mass transfer (diffusion) and grain boundary movement (interface movement) proceed at the same time, resulting in an extremely strong bonding. Examples of the means for moving the bonding interface toward the polycrystal side include (i) a method in which heat treatment is performed at a temperature of at least 80% of the melting point, (ii) a method in which the contacting face is coated with an aluminum or silicon source (such as a colloidal substance, or a salt, alkoxide, or the like thereof) that will eventually become an oxide, and (iii) a method in which a negative temperature gradient (at least −5° C./cm) is applied from the single crystal toward the polycrystal. These methods can be combined as desired.

If the bonding interface shown in FIG. 6 can be formed, then the bonding will be complete enough that a joined Nd:YAG single crystal and YAG polycrystal cannot be distinguished from a single, unbonded Nd:YAG single crystal (that is, the presence of an interface cannot be detected) when the transmission wavefronts of the two are observed by interferometer.

This can be confirmed from a laser damage test of an Nd:YAG single crystal-YAG single crystal produced by prior art, and the Nd:YAG single crystal-YAG polycrystal of the present invention, which have both been worked into the same shape (heat treatment for 10 hours at 1750° C. after uniaxial pressing at 10 kg/cm² or less). The results of an actual test revealed that the laser element of prior art had cracks in the bonding interface at LD excitation at a wavelength of 808 nm and a photon density of about 4 MW/cm². In contrast, with the product of the present invention, even though the power was 18 MW/cm², no change in the transmission wavefront was detected, either by interferometer or visual inspection.

There are no particular restrictions on the Nd:YAG single crystal used in the present invention, and one produced by a known method such as a CZ method can be used. A commercially available product can also be used.

Meanwhile, the YAG polycrystal can be manufactured by the following procedure, for example. First, an $Al_2O_3$ powder and a $Y_2O_3$ powder are used as the raw material powders. The average primary particle size of the $Al_2O_3$ powder may be about 0.1 to 1.0 μm. The average primary particle size of the $Y_2O_3$ powder may be about 0.02 to 0.2 μm.

The sinterability of the $Al_2O_3$ powder and the $Y_2O_3$ powder (the main components) is preferably set such that after the production of powder compacts of these powders at a CIP pressure of 1000 kg/cm², the density of the $Al_2O_3$ will be at least 98% of the theoretical density after sintering for 1 hour at 1400° C. (in an oxygen atmosphere), and that of $Y_2O_3$ will be at least 97% of the theoretical density after sintering a powder compact produced under the same conditions as above for 1 hour at 1700° C.

There are no particular restrictions on the method for preparing the above-mentioned $Al_2O_3$ powder and $Y_2O_3$ powder, as long as it is a method that gives a powder with an average primary particle size of 1 μm or less (it is preferable to use an active powder of 0.1 μm or less for the $Y_2O_3$, which is particularly difficult to sinter), and any known method can be employed.

With the present invention, other components can be added as needed to the raw material powders. For example, a silicon component can be added to more effectively avoid the production of local abnormal particles that accompanies a lack of uniformity, or the formation of a grain boundary phase in a Nd:YAG ceramic. Colloidal silica, TEOS (tetraethyl orthosilicate), or the like can be used favorably as the supply source for the silicon component.

With a YAG ceramic produced by sintering, an unreacted phase such as $YAlO_3$, $YAl_2O_9$, $Al_2O_3$, or $Y_2O_3$, and an impurity phase such as $(NdY)AlO_3$ tend to be produced. If these phases are present, they become a source of scattering because they have a different refractive index from that of the garnet that serves as the matrix crystal material. Silicon is an extremely effective way to avoid the production of an unreacted phase or impurity phase in the YAG ceramic. In this case, the silicon is preferably added in an amount of no more than 1000 weight ppm. Setting this added amount allows the production of an unreacted phase or impurity phase to be more effectively avoided while maintaining the laser emission efficiency, laser beam quality, and so on. As long as the silicon ($Si^{4+}$) is added in a suitable amount, it will have almost no effect on optical scattering because they will be replaced with $Al^{3+}$ ions in the YAG lattice. Cation defects occur when tetravalent ions are replaced with trivalent ions. In this case, since electrons are not trapped in the above-mentioned defects during the energy transition discussed above, at a given neodymium concentration, the performance will be equal to or better than that of a Nd:YAG single crystal to which no silicon has been added. Though a solid solution with a neodymium concentration of only about 1 at % is obtained with a single crystal, with a YAG ceramic (polycrystal) to which a trace amount of silicon has been added, the solid solution concentration will be about 10 times higher, which makes it possible to enhance the laser characteristics.

The silicon component is preferably added in an amount of no more than 1000 weight ppm (and more preferably about 5 to 600 weight ppm) as elemental silicon. In this case, the aluminum component and so forth in the YAG may be suitably adjusted according to the added amount of silicon so that there will be no deviation from the stoichiometric composition, regardless of whether the powder is produced by a solid phase method or a wet method.

A mixed powder having a stoichiometric composition (garnet composition) is prepared by uniformly mixing these powders. The purity of these powders is preferably at least 99.9 wt %.

With the present invention, a garnet powder of the targeted composition can be obtained ahead of time by co-deposition, an alkoxide method, or another wet synthesis method, in addition to a method involving the use of an $Al_2O_3$ powder and a $Y_2O_3$ powder. A mixed powder containing other powder components in this garnet powder can also be used. The average primary particle size of these powders is preferably 1 μm or less. The purity of these powders is preferably at least 99.9 wt % in each case.

Next, a YAG polycrystal can be obtained by molding and firing the raw material powder by a known method. If the product does not need to be transparent, a high-density sintered body can be obtained at a firing temperature of 1600° C. or lower. On the other hand, if transparency is required, the firing may be performed at about 1650 to 1850° C.

When a polycrystalline Nd:YAG ceramic is to be produced, an alcohol-based organic solvent or distilled water and, if needed, a binder, dispersant, or the like, are added to the above powder, and the components are wet mixed in a ball mill to prepare a slurry. The slurry thus obtained is dried and granulated in a spray dryer. The granulated powder thus obtained is formed into a specific shape by uniaxial pressing, CIP (cold isostatic pressing), or another such method. The formed body is degreased at 1000° C. or lower to remove the binder and any other organic component, and then sintered. The sintering atmosphere may be a reductive atmosphere, an oxidizing atmosphere, a vacuum, or an inert atmosphere. If the atmosphere is a vacuum, the sintering can be performed at a temperature of 1500 to 1850° C. HIP (hot isostatic pressing) or another such high-pressure sintering method may also be used. Or, a high-pressure sintering method may be combined with normal pressure sintering or vacuum sintering.

The Nd:YAG polycrystal used as the laser medium of a solid state laser and the YAG polycrystal that intersects the oscillated laser preferably have at least one of the following characteristics (and preferably have all of them). (i) The pore density is no more than 200 ppm by volume, and particularly no more than 20 ppm by volume; (ii) a YAG single phase is confirmed by X-ray diffraction analysis; (iii) the change in refractive index (Δn) of the interior of the sinter is no more than $1\times10^{-3}$, and particularly no more than $1\times10^{-4}$ (a polycrystal at or under this value is to be used); and (iv) no birefringence is observed by overall observation using a polarizing plate and in micro-observation with a polarizing microscope.

Laser oscillation will be obtained more efficiently if the amount of scattering of the polycrystal material disposed in an intersecting type of composite laser is no more than 10%/cm (and particularly no more than 3%/cm). From this standpoint, manufacture is preferably conducted under conditions of a sintering temperature of 1750 to 1850° C. and a sintering atmosphere with a vacuum of $10^{-4}$ Torr or lower (with $Cr^{4+}$:YAG, however, a pure oxygen atmosphere is preferable). The sintering time is preferably from 5 to 100 hours.

The mixing time and sintering conditions are preferably set to ensure uniform mixing. It is also preferable for most of the added $Si^{4+}$ ions to be substituted for the $Al^{3+}$ ions in the Nd:YAG crystal lattice. To this end, the sintering time is preferably at least 2 hours, and particularly at least 5 hours. The cooling rate after sintering is preferably from 1000 to 100° C./hr after sintering in order to incorporate as much of the $SiO_2$ as possible into the interior of the crystal. In particular, controlling the cooling rate in a temperature range from the sintering temperature to 1000° C. is extremely effective.

Whether or not the silicon has been substituted can be determined, for example, by (i) a method in which a substance other than an optically isotropic body, such as a hetero phase or grain boundary phase containing silicon, is identified, (ii) a method in which the grain boundary (crystal grain boundary) is detected by combining scanning electron microscopy (SEM) or transmission electron microscopy (TEM) with energy dispersive X-ray analysis (EDX) or wavelength dispersive X-ray analysis (WDX), and (iii) a method in which detection is performed by secondary ion mass spectrometry (SIMS), ion microanalysis (IMA), and nuclear magnetic resonance (NMR).

The coefficient of thermal expansion of the second crystal body used is preferably the same as, or close to, the coefficient of thermal expansion of the oscillation body. For example, if the second crystal body is composed of material other than a metal, then its coefficient of thermal expansion is preferably within ±30%, and particularly within ±15%, of the coefficient of thermal expansion of the oscillation body (Nd:YAG in the above case). If the second crystal body is a metal, then its coefficient of thermal expansion is preferably within ±50%, and preferably within ±30%, of the coefficient of thermal expansion of the oscillation body (Nd:YAG in the above case) because the material itself has the ductility characteristic of metal bonds. If the material being joined is a conventional single crystal-single crystal, only materials that are the same or only slightly different can be bonded because of the need for matching the coefficients of thermal expansion and material flexibility. With the present invention, by contrast, at least one of the materials being joined is a polycrystal, or if a polycrystal is interposed so that single crystals are not joined to each other, which reduces the strain that is generated at the bonding interface (strain produced by the difference in the coefficients of thermal expansion of the two crystals) and, at the same time forms a stronger bonding interface.

The second crystal body may be a material other than YAG. In particular, if heat dissipation is required in high output operation, for example, heat generated by the laser medium can be effectively eliminated by forming the second crystal body from a material having better thermal conductivity than the laser medium (such as sapphire or a metal).

As methods for imparting any of various functions to the second crystal body, the sensitization effect during lamp excitation, the effect of reducing color center generation by ultraviolet rays, and so forth can be obtained by disposing a transparent $Cr^{3+}$:YAG polycrystal or $Ce^{3+}$:YAG polycrystal. A number of different effects can be obtained by combining these methods.

FUNCTION OF THE INVENTION

In general, the rate at which energy is converted into a laser beam with a solid state laser is 2 to 3% with lamp excitation and about 20 to 35% with semiconductor laser excitation (an optical-optical conversion efficiency of 40 to 70%), and the rest becomes thermal energy. Accordingly, it is extremely important from the standpoints of increasing output, improving beam performance, and so on to have some way of dissipating heat during high output operation.

With the composite laser element of the present invention, an excellent joining state can be achieved by joining a polycrystal to a single crystal or a polycrystal. This allows a second crystal body to be bonded well with an oscillation body. Forming this second crystal body also has other benefits, such as allowing heat to be eliminated more effectively during laser generation, as well as eliminating ultraviolet rays during lamp excitation, sensitizing $Nd^{3+}$ by the addition of $Cr^{3+}$, and forming a Q switch of $Nd^{3+}$:YAG by saturable absorption of $Cr^{4+}$.

EXAMPLES

Examples and comparative example will now be given to further clarify the features of the present invention, but the scope of the present invention is not limited to or by these examples.

Examples 1 to 9

Composite laser elements having the structure shown in FIG. 5 were produced. The specific structure is shown in Table 1.

The clad core structure was such that the inner peripheral face of the core and the outer peripheral face of the clad were given a mirror finish in the machining of the core and clad, and the clearance between the two was adjusted to about 50 μm. When the clad was platinum, though, the outer peripheral face of the core was not mirror-polished, and was roughened to about #200.

The core was put into the clad, this assembly was put into a platinum or molybdenum capsule, and the material were joined by HIP at a temperature of 400 to 1600° C. and a pressure of 100 to 2000 kg/cm². After this HIP treatment, the product was heat treated as necessary to increase the bonding strength. Both end faces of the composite laser element thus obtained were optically polished, and 1) the output characteristics when the laser was oscillated (threshold value (W)/slope efficiency (%)) and 2) the maximum output in single mold oscillation and multi-mode oscillation were measured. These results are given in Table 1.

TABLE 1

| Ex. | Core | Nd conc. (at %) | Core size diam./length (mm) | Clad | Clad size outside diam./length (mm) | Clad CTE CTC | Laser oscillation[1] Threshold (W)/slope efficiency (%) | Max output (W)* |
|---|---|---|---|---|---|---|---|---|
| 1 | single crystal | 0.6 | 5.6/15.0 | YAG polycrystal | 12.0/15.0 | 8.0 12 | 0.2/12.6 | 8 28 |
| 2 | single crystal | 1.0 | 4.0/12.0 | YAG polycrystal | 12.0/12.0 | 8.0 12 | 0.3/24.6 | 12 38 |
| 3 | single crystal | 1.0 | 4.0/12.0 | BeO polycrystal | 12.0/12.0 | 7.5 240 | 0.3/26.2 | 14 45 |
| 4 | single crystal | 1.1 | 4.0/12.0 | TiC polycrystal | 12.0/12.0 | 7.0 120 | 0.3/27.6 | 16 52 |
| 5 | single crystal | 1.1 | 3.5/15.0 | Pt polycrystal | 10.0/15.0 | 8.0 70 | 0.3/27.8 | 16 58 |
| 6 | poly- crystal | 1.0 | 4.0/12.0 | YAG polycrystal | 12.0/12.0 | 8.0 12 | 0.3/24.8 | 14 40 |
| 7 | poly- crystal | 2.2 | 4.0/5.0 | $Al_2O_3$ polycrystal | 12.0/5.0 | 7.2 30 | 0.4/28.6 | 18 48 |
| 8 | poly- crystal | 3.7 | 3.0/3.0 | BeO polycrystal | 12.0/3.0 | 7.5 30 | 0.5/31.0 | 22 52 |
| 9 | poly- crystal | 5.8 | 3.0/1.5 | Pt polycrystal | 12.0/1.5 | 8.0 70 | 0.8/30.9 | 26 46 |

Ex.: Example

CTE: coefficient of thermal expansion (×$10^{-4}$/deg)

CTC: coefficient of thermal conductivity (W/mk)

*Maximum output of laser oscillation[5]

Top: single mode oscillation

Bottom: multi-mode oscillation

The test indicated by 1) above was conducted by continuous oscillation. The test piece (whose core was a transparent crystal material capable of laser oscillation) was optically polished to an average surface roughness Ra of 0.1 to 0.5 nm, a flatness of λ/10 (λ=633 nm), and a parallelism of 10 sec. The test piece surface was given an antireflective treatment with a dielectric multilayer film, and end face excitation was performed with a semiconductor laser having a wavelength of 808 nm as the excitation light source. A total reflection mirror was installed on one side of the test piece, while a half-mirror (2% transmittance) was installed on the other. The 1064 nm laser beam emitted from the output mirror was measured with an optical power meter. The table shows the cw laser emission threshold and the slope efficiency after laser emission.

As to the maximum output in laser oscillator in 2) above, the top figure indicates the value when the excitation power was increased and the oscillation moved from single mode to multi-mode, while the bottom figure indicates the maximum output up to the point when a decrease in output occurs as a result of a thermal lens effect. The 1064 nm laser beam emitted from the output mirror was oscillated with an optical power meter and the resulting laser was measured with a beam profiler, and these values were obtained by evaluation of single mode or multi-mode.

Comparative Examples 1 to 3

Composite laser elements with the structure shown in Table 2 were produced. In Comparative Examples 1 and 2, a cylindrical single crystal obtained by boring from an ordinary single crystal boule (composed of Nd:YAG single crystal) was used as the laser medium. In Comparative Example 3, a 1.0 at % Nd:YAG single crystal was cut into a prismatic shape, and the side faces thereof (four sides) were clad with YAG single crystal.

Figure 7:
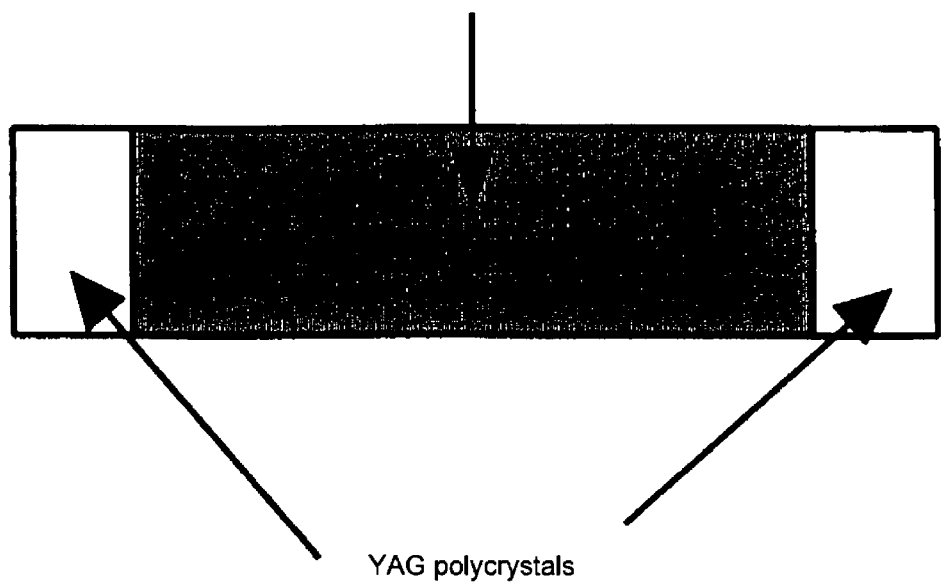
FIG. 7 is a schematic diagram illustrating the structure of the composite laser element of Example 10.
Figure 8:
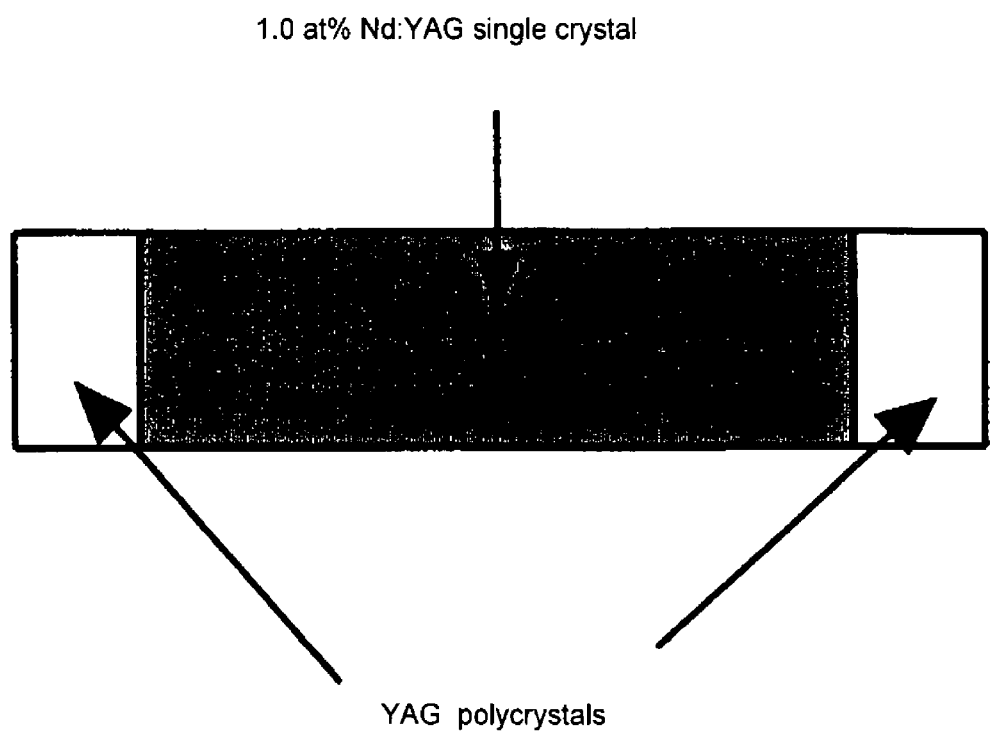
FIG. 8 is a schematic diagram illustrating the structure of the composite laser element of Comparative Example 4.

In bonding step, the contacting faces were optically polished to λ/2, and hot pressing was performed for 1 hour at 1500° C. and 200 kg/cm$^2$. The laser evaluation test piece was subjected to the same polishing and surface treatment as in Example 1, and subjected to a laser oscillator test. These results are given in Table 2.

and 100 kg/cm$^2$, after which they were heat treated for 5 hours at 1600° C., while the present invention products were heated for 1 hour at 1750° C. and 1 kg/cm$^2$. This gave composite laser elements having the structures shown in FIGS. 7 and 8. FIG. 7 shows a present invention product (Example 10), and FIG. 8 a comparative product (Comparative Example 4).

Figure 9:
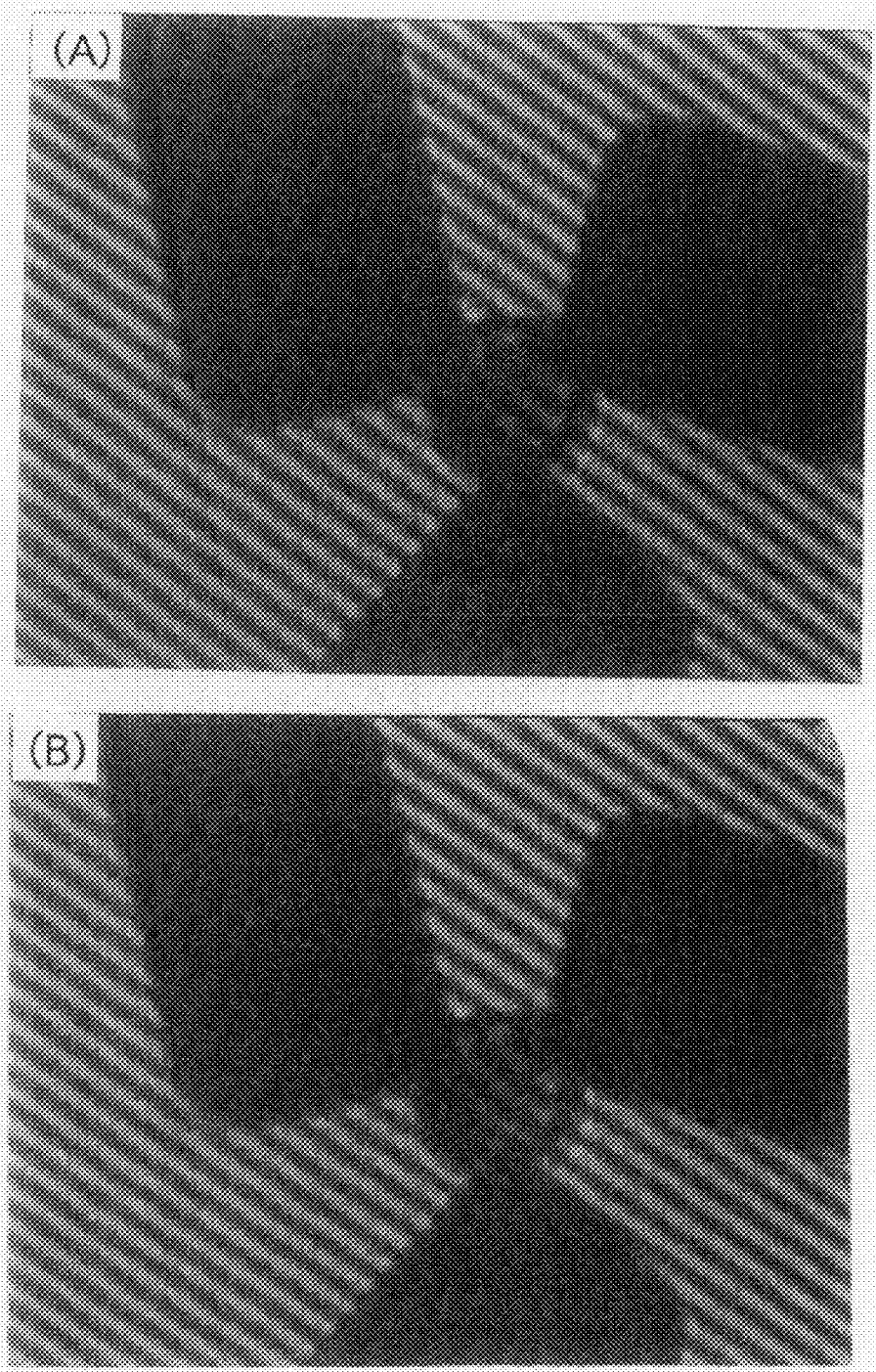
FIG. 9 is a simulation of the transmission wavefront in Example 10.
Figure 10:
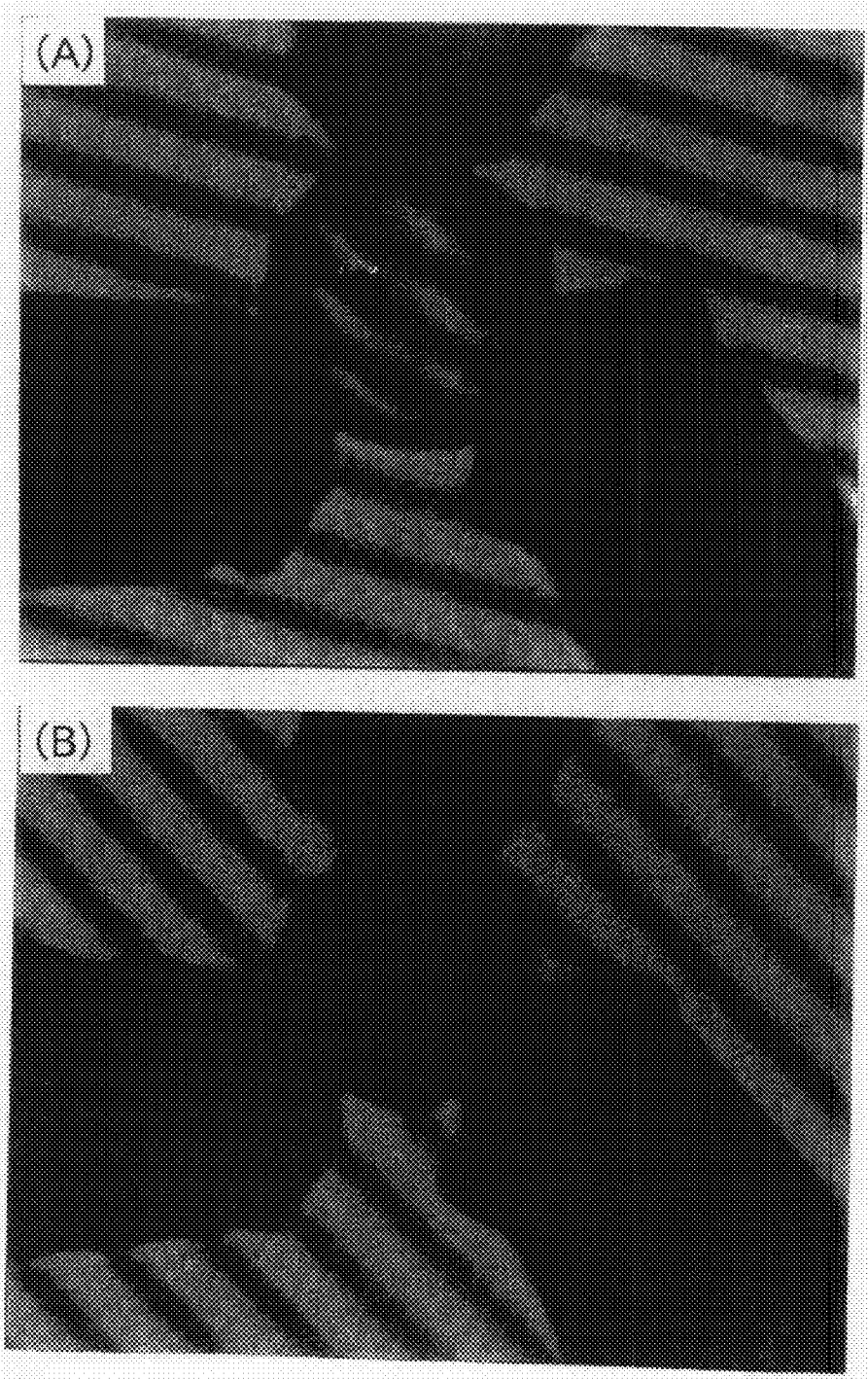
FIG. 10 is a simulation of the transmission wavefront in Comparative Example 4.

The end faces of the composite laser elements thus produced were optically polished, after which dielectric multilayer films were formed. The bonding state was evaluated by exciting these elements with a semiconductor laser at a continuous output of 40 W and a wavelength of 809 nm. FIGS. 9A and 10A show the results of measuring the state of the transmission wavefront by Fizeau interferometer before and after bonding in Example 10 and Comparative Example 4. In both cases, a wavefront that is nearly straight is formed.

FIG. 10B is the results of repeated excitation for 2 hours with the above-mentioned semiconductor laser as in Comparative Example 4, but no formation of transmission interference fringes was observed. As to laser output, laser oscillation at an output of 22 W was confirmed within 1 hour, but after that the output gradually decreased, and after 1 hour and 50 minutes laser oscillation had become impossible.

FIG. 9B shows the results of repeated excitation for 1000 hours in Example 10 under the same conditions as in Comparative Example 4. Even after 1000 hours, no change was noted in the transmission wavefront of the laser element. As to the change in output, the initial output was 26.1 W, while that after 1000 hours had elapsed was 26.0 W, so it can be seen that almost no change in output was detected.

A destructive test was conducted on another test piece using a semiconductor laser with a maximum output of 500 W and a wavelength of 808 nm (the excitation density was varied by means of the convergence of the laser beam), but in Comparative Example 4 the bonding face was destroyed in just 1 hour at an excitation density of 4 MW/cm$^2$. In contrast, the composite laser element of the present invention underwent no change after 25 hours of testing at an excitation density of 12 MW/cm$^2$, so the excitation density was increased to 50 MW/cm$^2$, at which point slight cracking was finally noted. How cracks occurred with prior art was such that cracking

TABLE 2

| Com. Ex | Core | Nd conc. (at %) | Core size diam./length (mm) | Clad | Clad size outside diam./length (mm) | Clad CTE CTC | Laser oscillation[1] Threshold (mW)/slope efficiency (%) | Max. output (W)* |
|---|---|---|---|---|---|---|---|---|
| 1 | single crystal | 0.6 | 8/15 | none | — | — | 0.2/11.3 | 4 / 10 |
| 2 | single crystal | 1.0 | 8/12 | none | — | — | 0.3/22.5 | 6 / 14 |
| 3 | single crystal | 1.0 | 4 mm sq./12 mm long | YAG single crystal | 12 mm sq./12 mm long | 8 / 12 | 0.3/23.1 | 10 / 19 |

Test Example 1

A laser damage test was conducted. To evaluate resistance to excitation energy, composite laser elements were produced in the same shape as the products of the present invention and the comparative examples. The laser oscillation medium was 1 at % Nd:YAG single crystal (diameter of 8 mm, length of 15 mm), to both ends of which were bonded YAG polycrystals or YAG single crystals (both having a diameter of 8 mm and a length of 3 mm). In this bonding, the contacting face between the Nd:YAG single crystal and the YAG polycrystal or YAG single crystal was optically polished (flatness λ/10, Ra=0.2 nm). The comparative products were hot pressed at 1500° C.

parallel to the bonding face (separation of the bonding face itself) proceeded, whereas with the present invention the cracking was at a right angle to the bonding interface, so it is clear that the bonding state has been markedly improved.

Furthermore, with the same element structure as in Comparative Example 4, when the bonding interface between the single crystal and polycrystal was coated with 1 wt % colloidal silica for bonding, and a heat treatment was performed for 10 hours at 1750° C. in a vacuum and under no load (own weight) while a negative temperature gradient of 5° C./cm was applied from the single crystal side to the polycrystal material side, it was confirmed that interfacial movement (that is, single crystallization) of approximately 500 μm had occurred from the single crystal side to the polycrystal side. This material was subjected to a laser damage test by the same method, and as a result no abnormality whatsoever was noted even at 50 MW/cm$^2$. Furthermore, when the excitation density was raised to 150 MW/cm$^2$, cracking that was shallow on the polycrystal side and deep on the single crystal side was detected from the vicinity of about 500 μm away from the interface, rather than at the initial contacting face of the Nd:YAG-YAG single crystal/YAG polycrystal, but the bonding interface had been moved toward the polycrystal side, that is, the initial contacting face had disappeared, which resulted in markedly stronger bonding.

Next, while the basic structure was the same as in Example 4, YAG single crystals with a crystal orientation of <110> were jointed to the two ends, using Nd:YAG polycrystal for the center portion. A heat treatment was performed for 10 hours at 1780° C. and with the same negative temperature gradient of 5° C./cm applied from the YAG single crystal side disposed at both ends of the test piece, which resulted in almost all of the material being converted to single crystal (single crystallization occurred in at least the region through which the oscillated laser beam passed). It is possible to provide an ideal laser element with which a joining interface such as that in prior art is not present in the region of the Nd:YAG-YAG single crystal element through which the laser passes. When this element was excited with the above-mentioned semiconductor laser, there was no damage whatsoever even at 150 MW/cm$^2$, nor was there any problem at 250 MW/cm$^2$, which is the convergence limit, and continuous oscillation over an extended period was possible. The present invention markedly increases damage[6] with respect to excitation light as compared to prior art, but the bonding state may be suitably selected according to the design of the laser oscillator.

Test Example 2

A composite laser element was produced by joining a Nd:YAG polycrystal and a Cr$^{4+}$:YAG single crystal. With prior art, to actuate Cr$^{4+}$:YAG that can be oscillated with a short pulse, generally the Nd:YAG is excited with a semiconductor laser of 808 nm, and the saturable absorption characteristics of Cr$^{4+}$:YAG are utilized as a Q switch, but with this constitution, single mode pulse oscillation having high beam quality is impossible. With the present invention, this technological problem was surmounted by producing a composite laser element of 2.7 at % Nd:YAG polycrystal (high-concentration Nd:YAG polycrystal) and 0.1 at % Cr$^{4+}$:YAG single crystal (both having a diameter of 8 mm and a height of 2 mm) as Example 11. First, the contacting faces of the two materials were optically polished to an Ra of 0.3 nm and within λ/4. The polished faces were brought into contact, a platinum capsule was formed in this state, and HIP was carried out for 3 hours at 1300° C. and 1000 kg/cm$^2$. After the HIP treatment, the product was heat treated for another hour at 1700° C. to strengthen the bonding. As shown in FIG. 11a, the test piece surface was subjected to an antireflective treatment with a dielectric multilayer film, and excitation was performed with a semiconductor laser having a wavelength of 808 nm and an output of 20 W as the excitation light source. It was confirmed that a single, vertical mode, high-quality pulse laser beam with a pulse width of 20 nsec and an output of 1 mJ was emitted from this oscillator. The output was measured with a power meter, the pulse width was measured with an oscilloscope, and the single vertical mode was found by measuring the emission spectrum with a scanning Fabry-Pérot interferometer.

Meanwhile, in Comparative Example 5, a composite laser element was produced using 1.0 at % Nd:YAG single crystal and Cr$^{4+}$:YAG single crystal of the same size as in Example 11, but oscillation was impossible.

Also, as shown in FIG. 11b, a 1.0 at % Nd:YAG single crystal rod (8 mm in diameter, 30 mm long) was produced, and this and the above-mentioned Cr$^{4+}$:YAG single crystal (as a saturable absorber) were used separately, without being compounded, whereupon laser oscillation was confirmed, but since it was not single vertical mode, an etalon had to be inserted as a mode selector, which finally made single emission possible. With the comparative product, not only was the oscillator volume 30 times that of the present invention, and the emission efficiency one-half, but an extremely expensive etalon was required, and the superiority of the present invention was also confirmed from a technological standpoint.

Example 12

A super-high-output pulse laser oscillator was produced using the composite laser element obtained in Example 11.

Figure 12:
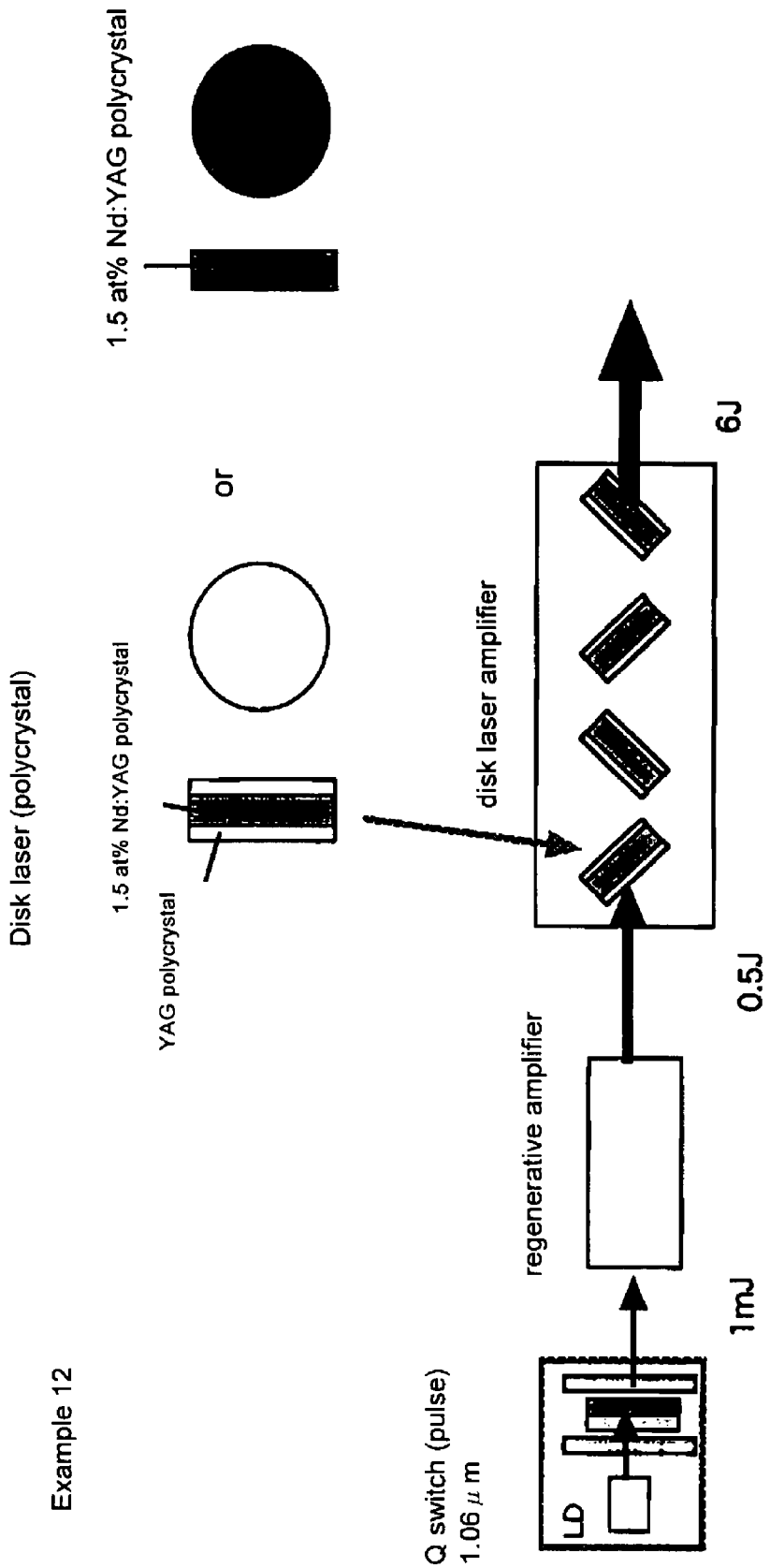
FIG. 12 is a simplified diagram illustrating the structure of an oscillator featuring the laser element of Example 12.

As shown in FIG. 12, when a small switched laser oscillator featuring the composite laser element of Nd:YAG polycrystal and Cr$^{4+}$:YAG single crystal of Example 11 was amplified with a commercially available regenerative amplifier, the laser was amplified up to a pulse width of 20 nsec and an output of 500 mJ.

Furthermore, as shown in FIG. 12, to this was added an amplifier (excited by semiconductor laser) in which a composite disk laser element, comprising a 1 mm YAG polycrystal (this may be a single crystal if the oscillation medium is a polycrystal) disposed on both sides of a Nd:YAG single crystal (or Nd:YAG polycrystal) with a diameter of 30 mm and a thickness of 4 mm or a 1.5 at % Nd:YAG polycrystal with a diameter of 30 mm and a thickness of 5 mm, was set up to Brewster's angle, which increased by output to 6 J. A super-high-output (6 J) having a single vertical mode was obtained with an oscillator structure that was far more compact than with prior art. This should afford more applications to laser machining technology.

Example 13

Figure 13:
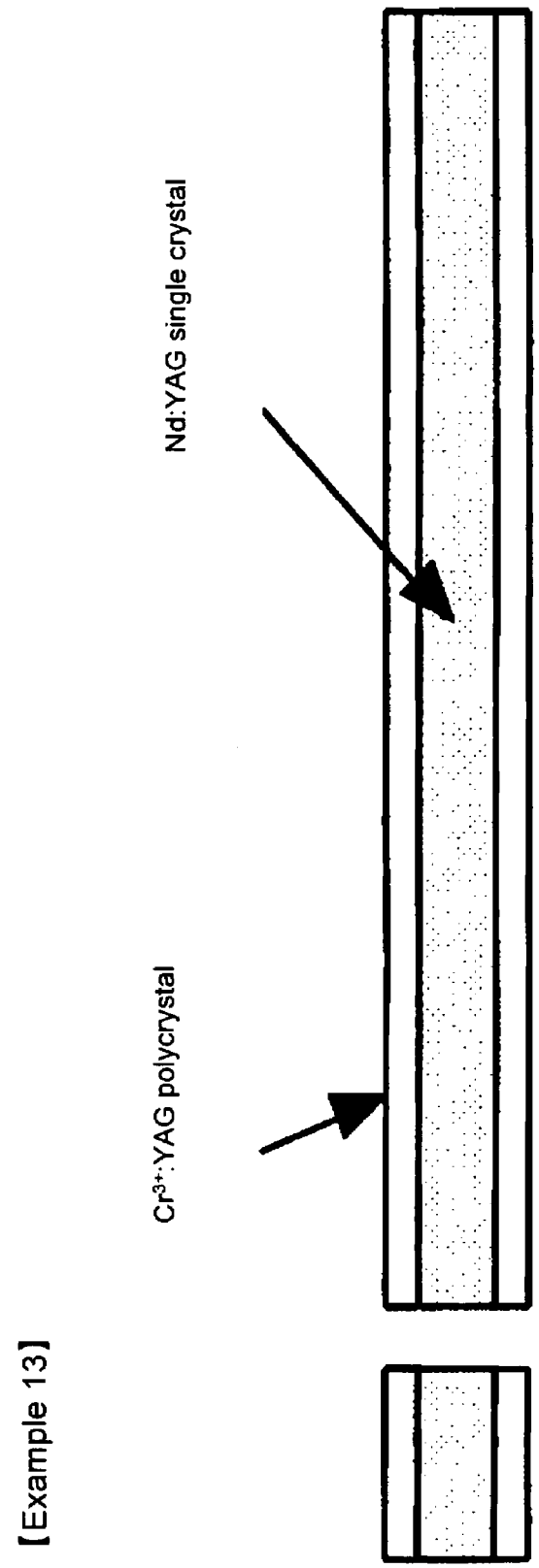
FIG. 13 is a schematic diagram (side view and cross section) illustrating the structure of the composite laser element of Example 13.

A composite laser element was manufactured by joining a 1 at % Cr$^{3+}$:YAG polycrystal with a thickness of 2.0 mm to the total reflection face of a 1.0 at % Nd:YAG single crystal slab with a length of 200 mm, a width of 25 mm, and a thickness of 4.5 mm. FIG. 13 shows the structure of this composite laser element. The contacting faces, which had been polished to an Ra of 1 nm and a flatness of λ were pressed tightly together and heat treated for 1 hour at 1000° C. and under a load of 5 kg/cm$^2$. After this, the entire element was covered with a tantalum capsule and subjected to HIP for 1 hour at 1500° C. and 500 kg/cm$^2$. After this treatment, the capsule was removed and the composite laser element was heat treated for another 3 hours at 1700° C. to strengthen the joint. The end faces of the slab were then cut at Brewster's angle, and the Brewster faces and the total reflection face were optically polished to be parallel and flat. As a result, the Cr$^{3+}$:YAG polycrystal layer had a thickness of 1.5 mm.

The composite laser element was installed in a conventional xenon lamp-excited laser oscillator, and a CW laser oscillation test was conducted, whereupon laser oscillation of 1.1 kW was confirmed at an input of 20 kW (oscillation efficiency of 5.5%). A 1.0 at % Nd:YAG single crystal slab of substantially the same shape and measuring 215 mm long, 25 mm wide, and 6.5 mm thick was evaluated with the same oscillator, but the output was only 520 W at an input of 20 kW (oscillation efficiency of 2.6%). Also, this composite laser element was subjected to a durability test at a cw output of 900 W, but no decrease in output was noted after 500 hours (the lamp was replaced every 100 hours).

Example 14

Figure 14:
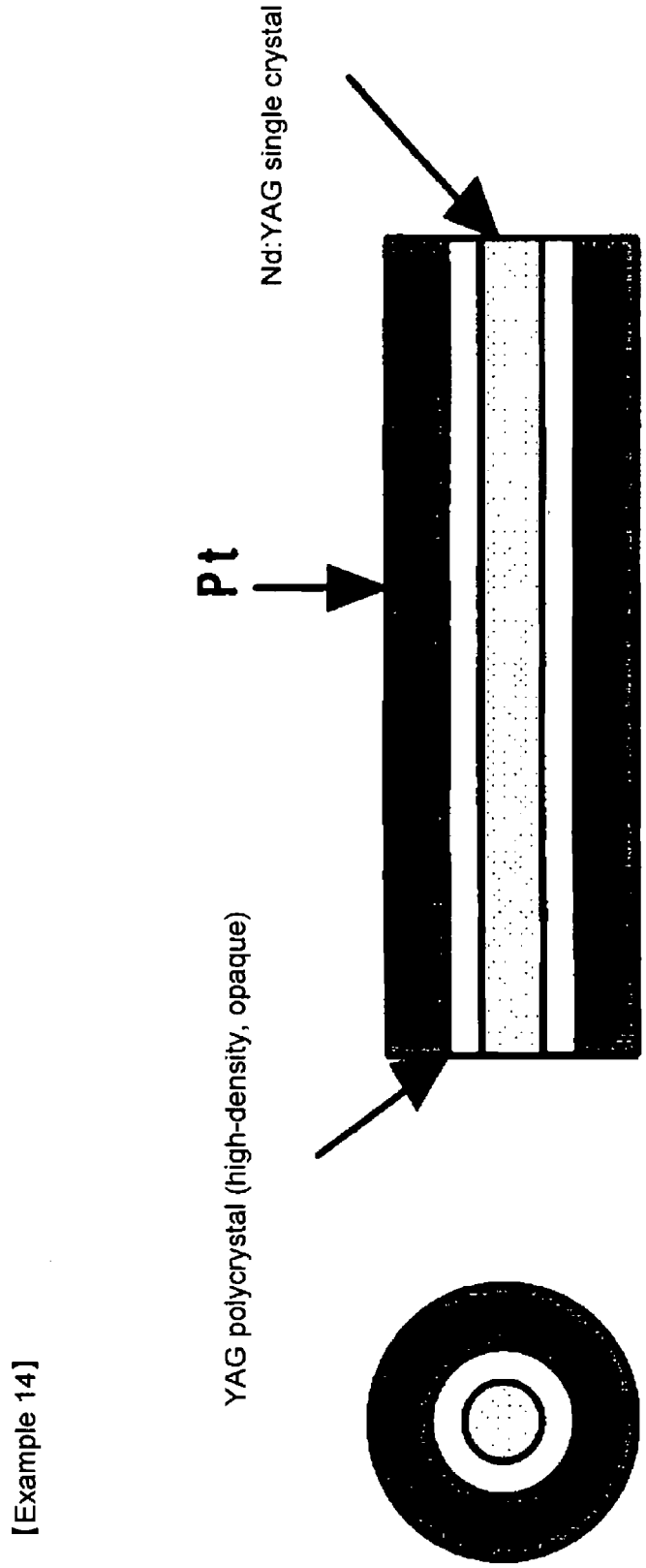
FIG. 14 is a schematic diagram (side view and cross section) illustrating the structure of the composite laser element of Example 14.

A composite laser element having the structure shown in FIG. 14 was produced. First, a YAG polycrystal (opaque) with a thickness of 1 mm was applied as the first layer around the outside of a 1.1 at % Nd:YAG single crystal rod with a diameter of 3.5 mm and a length of 50 mm, and then a platinum layer with a thickness of 2 mm was bonded around the outside of this. The peripheral surface of the Nd:YAG single crystal and the inner face of the YAG polycrystal were polished to a mirror finish, and the clearance between the two was set to 15 µm. The outer periphery of the YAG polycrystal was not polished to a mirror finish, and was instead roughened to an Ra of 150 µm, and a groove that was 0.3 mm wide and deep was also formed (for the purpose of enhancing heat dissipation and joint strength by forming unevenness on the surface. The clearance here between the YAG polycrystal and the tube was 50 µm, and this product was sealed in a platinum capsule in the set-up shown in FIG. 14. HIP was performed for 1 hour at 1400° C. and 2000 kg/cm². After this treatment, the capsule was removed and the ends were optically polished to produce a composite laser element with a three-layer structure. This composite laser element was water cooled, the end faces were excited with a semiconductor laser having a wavelength of 808 nm, and a laser oscillation test was conducted. The laser conversion efficiency was 25%, but the effect of the heat radiating structure produced a single mode up to a high output level of 100 W. Meanwhile, a 1.1 at % Nd:YAG single crystal with a diameter of 7 mm and a length of 60 mm was oscillated under the same conditions, but the single mode only lasted up to 10 W, and only an output of 35 W was attained even in multi-mode.

Example 15

Figure 15:
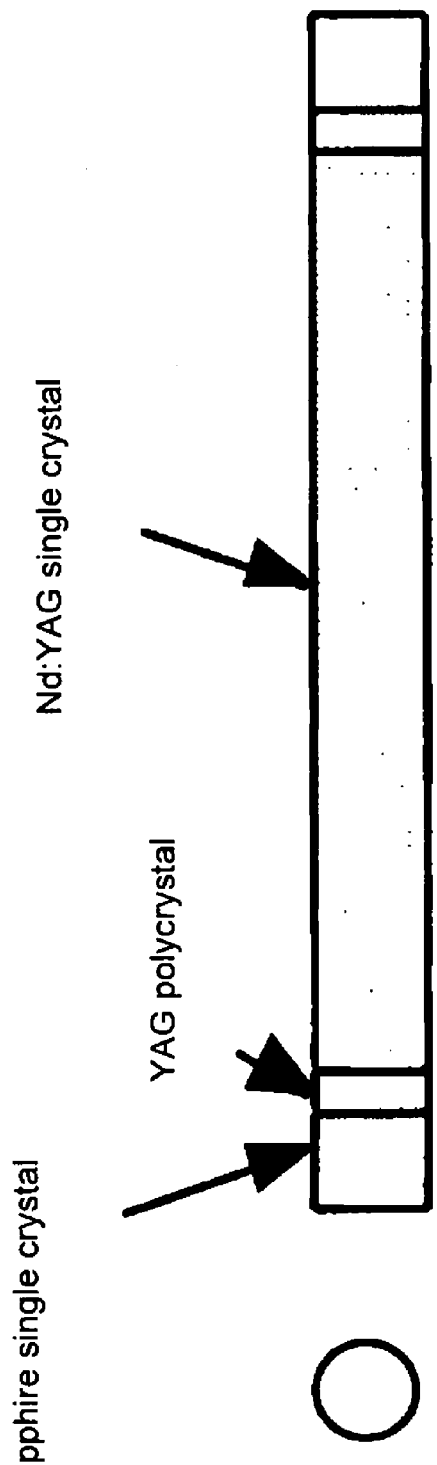
FIG. 15 is a schematic diagram (side view and cross section) illustrating the structure of the composite laser element of Example 15.

A composite laser element having the structure shown in FIG. 15 was produced. A YAG polycrystal (transparent) with a thickness of 1 mm was applied as the first layer to both end faces of a 1.1 at % Nd:YAG single crystal rod with a diameter of 4.0 mm and a length of 40 mm, and then a sapphire single crystal with a thickness of 3 mm was disposed around this. Both end faces of the Nd:YAG single crystal, both sides of the YAG polycrystal, and one side of the sapphire single crystal were optically polished to an Ra of 0.2 nm and a flatness of λ/6, and a heat treatment was performed with the contacting faces in contact. This was performed for 1 hour at 1200° C. and under a load of 2 kg/cm². The bonding was further strengthened by heat treating for 3 hours at 1550° C. under no load in an electric furnace. For the sake of comparison, an element of the same shape and made up of all the same single crystals (an element of a Nd:YAG single crystal, a YAG single crystal, and a sapphire single crystal) was produced under the same conditions, but the joining between the Nd:YAG single crystal and the YAG single crystal was so incomplete that the presence of a bonding interface was not discerned by the naked eye. Also, the bonding between the YAG single crystal and the sapphire single crystal underwent fine cracking at the bonding interface because the difference between the coefficients of thermal expansion was not lessened. With the composite laser element of the present invention, the sapphire single crystal at the end faces was optically polished, and this element was subjected to a laser oscillation test. This composite laser element was water cooled while its end faces were excited with a semiconductor laser having a wavelength of 808 nm, and a laser oscillation test was conducted. The laser conversion efficiency was 27%, but the heat radiating structure produced a high-quality beam having a Gaussian distribution in lateral mode up to a high output level of 50 W.

Example 16

Figure 16:
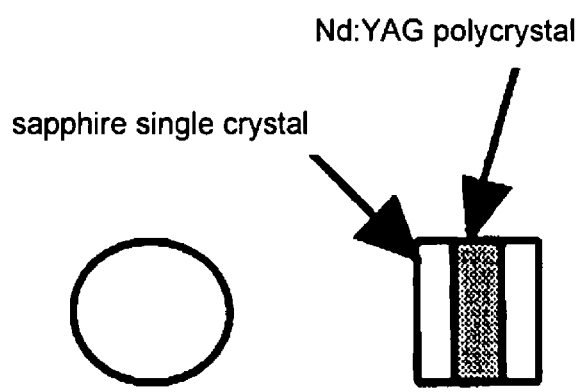
FIG. 16 is a schematic diagram (side view and cross section) illustrating the structure of the composite laser element of Example 16.

The composite laser element shown in FIG. 16 was produced. A sapphire single crystal with a thickness of 1 mm was disposed as a heat sink at both end faces of a 3.9 at % Nd:YAG polycrystal chip having a diameter of 6 mm and a thickness of 1.2 mm. Both end faces of the Nd:YAG polycrystal and one side of the sapphire single crystal disposed at both end faces were optically polished to an Ra of 0.3 nm and a flatness of λ/10, the joining faces were brought into contact, and in this state the weight of 0.5 kg of polycrystalline alumina (1.77 kg/cm²) was applied and held for 1 hour at 1200° C., and then a heat treatment was performed for 3 hours at 1500° C. under no load. The heat treated composite laser element of Nd:YAG polycrystal and sapphire single crystal was optically polished at the sapphire single crystal portion at both end faces, and this product was subjected to a laser oscillation test.

In laser oscillation, the composite laser element was fixed to a copper plate, and the experiment was conducted by exciting the end faces with a semiconductor laser having a wavelength of 808 nm. The laser conversion efficiency was approximately 19%. A single, vertical mode was achieved at up to a high output level of 5 W at a laser oscillation efficiency of 19% with a simple oscillator structure in which no etalon was inserted into the oscillator. Meanwhile, laser oscillation was attempted, unsuccessfully, in the same oscillator using an optically polished 1.0 at % Nd:YAG single crystal having a diameter of 8 mm and a thickness of 1.8 mm. Then, using an optically polished 1.1 at % Nd:YAG single crystal having a diameter of 7 mm and a thickness of 8 mm, an etalon was put into the interior of the oscillator and single, vertical mode oscillation was attempted. Oscillation was possible in vertical mode oscillation when the etalon was used as a mode selector, but the oscillation efficiency was 6.2% and the maximum output was 1.5 W, and the oscillator was over ten times as long. It can be seen from this that the composite laser element of the present invention provides a compact yet high-output oscillator.

Examples 17 and 18

Figure 17:
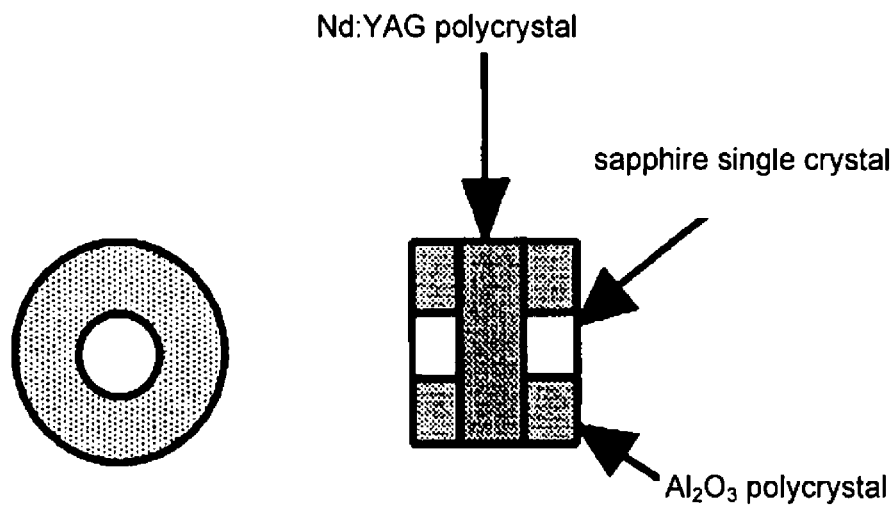
FIG. 17 is a schematic diagram (side view and cross section) illustrating the structure of the composite laser element of Example 17.
Figure 18:
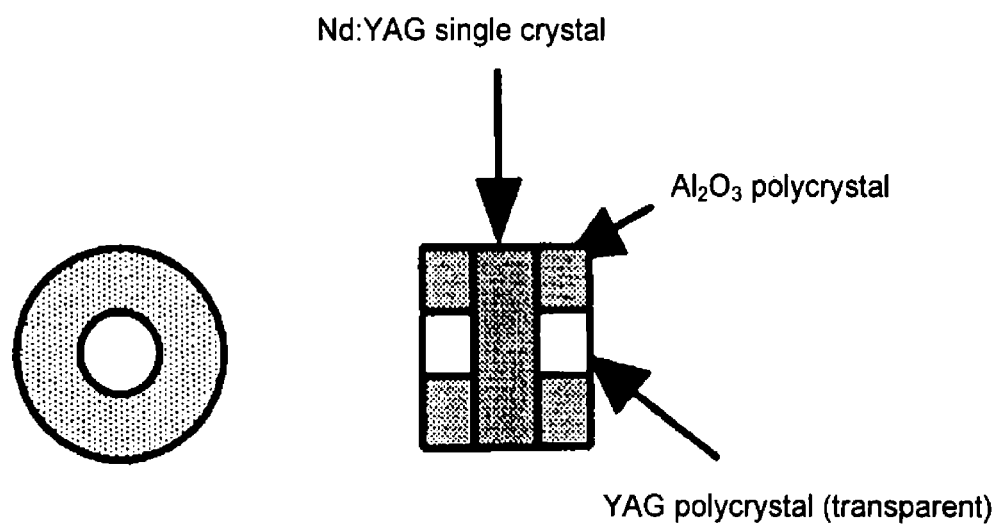
FIG. 18 is a schematic diagram (side view and cross section) illustrating the structure of the composite laser element of Example 18.

A Nd:YAG polycrystal and a Nd:YAG single crystal were used as the oscillation media, and composite structure elements were bonded to both end faces. In Example 17, first a sapphire single crystal was disposed as the core, and then an Al₂O₃ polycrystal was disposed as clad. In Example 18, the core was a YAG polycrystal, and the clad was an Al₂O₃ polycrystal. Next, just as in Example 14, the two parts were covered with a capsule to form a concentric circular element structure, and HIP was performed at 1600° C. and a pressure of 1000 kg/cm². The clad-core structure element thus produced was cut in the circumferential direction (into a round slice) and optically polished, after which the round slice was brought into contact with an oscillation medium that had been similarly polished, and heat treated at 1200° C. and a pressure of 1 kg/cm², which gave the composite laser elements shown in FIGS. 17 and 18.

Example 19

Figure 19:
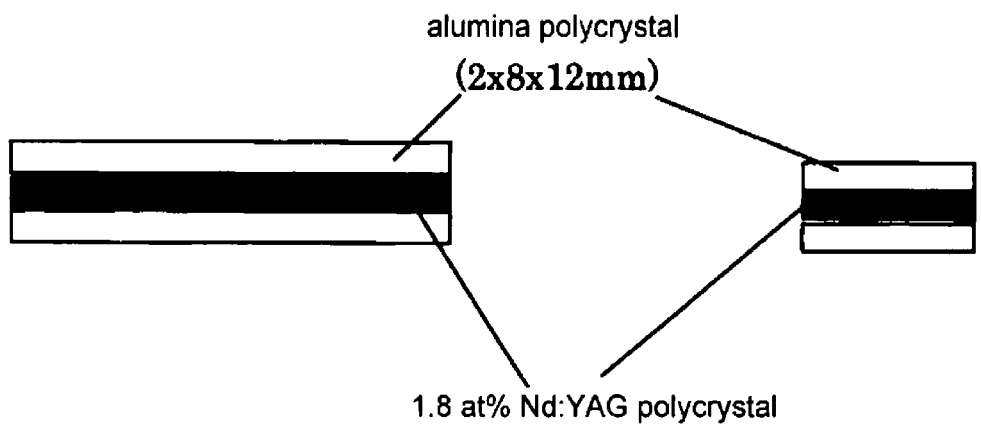
FIG. 19 is a schematic diagram (side view and cross section) illustrating the structure of the composite laser element of Example 19.

A composite laser element with the structure shown in FIG. 19 was produced. Both sides (5×12 mm) of a 1.8 at %

Nd:YAG polycrystal material measuring 3 mm thick, 8 mm wide, and 12 mm long were roughened to an Ra of 80 μm. Meanwhile, one side of $Al_2O_3$ polycrystals (two) measuring 2 mm thick, 8 mm wide, and 12 mm long were optically polished to an Ra of 1 nm and a flatness of $\lambda/2$. The machined Nd:YAG polycrystal was sandwiched and brought into contact between the $Al_2O_3$ polycrystals while a heat treatment was performed for 2 hours at 1500° C. and under a load of 5 kg/cm². Optical strain tends to occur if $Al_2O_3$ polycrystals and YAG, which have different coefficient of thermal expansion, are completely boned over a relatively large surface area (approximately 1 cm² in this case). When such a combination of optical elements is produced, the functioning of the element can be improved by making the surface of one or both of the materials relatively rough so that only partial bonding is performed. The object in this example is to produce a non-intersecting type of laser element, and even if an $Al_2O_3$ polycrystal is brought into partial contact with a composite laser element, its high thermal conductivity will still improve heat dissipation characteristics.

Examples 20 to 22 and Comparative Examples 20 to 22

Figure 20:
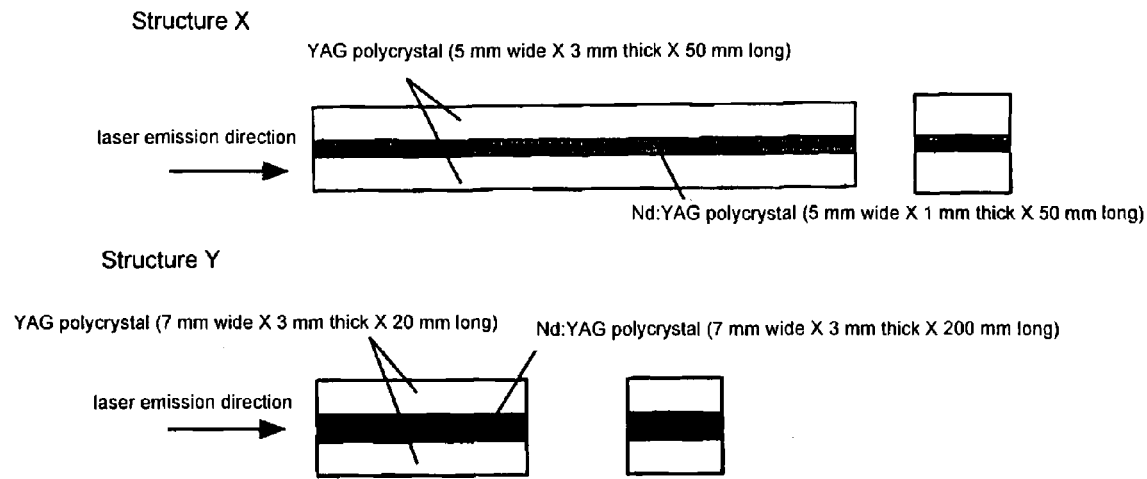
FIG. 20 is a schematic diagram (side view and cross section) illustrating the structure of the composite laser elements (structures X to Z) of Examples 20 to 22.

The structures X, Y, and Z shown in FIG. 20 were produced.

Structure X was a laminated structure in which a Nd:YAG polycrystal with a thickness of 1 mm was disposed in the center, and a YAG polycrystal with a thickness of 3 mm was disposed on both sides thereof. The contacting faces were finished to an Ra of 0.5 nm and a flatness of $\lambda/2$, after which a weight of approximately 1 kg was merely applied (0.4 kg/cm²) in Example 20, while in Comparative Example 20a load of 600 kg/cm² was applied with a hot press, and heat treatment was performed for 1 hour at 1700° C.

As a result, in Example 20 the Nd:YAG and YAG were integrated in the product, and no cracks or chips marred the appearance. On the other hand, in Comparative Example 20 the corners of the YAG polycrystal chipped, many cracks appeared in the Nd:YAG polycrystal in the center, and this situation made it impossible to use the product as a laser element at all.

Structure Y was a structure in which a relatively thick Nd:YAG polycrystal was in the center, and YAG polycrystals of the same thickness were disposed on both sides thereof. Just as with Structure X, the joining faces were finished to an Ra of 0.5 nm and a flatness of $\lambda/2$, after which a weight of approximately 5 kg was merely applied (2 kg/cm²) in Example 21, while in Comparative Example 21a load of 200 kg/cm was applied with a hot press, and heat treatment was performed for 1 hour at 1500° C., after which both were heat treated for 2 hours at 1750° C. in a no load state.

Example 21 gave a good bonded product in which the Nd:YAG and YAG were integrated, just as in Example 20. In contrast, in Comparative Example 21 chipping and cracking was confirmed at the bonding.

The joined products obtained above were polished to a mirror finish on both sides in the laser emission direction, and the products were checked with a strain gauge, which revealed that very slight strain (birefringence) was observed at just the boundary of the Nd:YAG joined to the YAG in Example 21, whereas in Comparative Example 21 strain was observed throughout the entire Nd:YAG polycrystal. This stain is predicted to result in an extremely disadvantageous situation in terms of beam quality and efficiency during laser operation, and also leads to a decrease in the service life of the element.

Structure Z was a structure in which a Nd:YAG polycrystal with a diameter of 10 mm and a thickness of 5 mm was in the center, and YAG polycrystals of the same diameter and a thickness of 10 mm were disposed on both sides thereof. The joining was carried out by the same method as in Example 21 and Comparative Example 21.

Both sides of the joined product were polished to a mirror finish, and this product was measured with a strain gauge, which revealed extremely low strain under the measurement limit in Example 22, while local in-plane strain was observed in Comparative Example 22.

The material used for structure Z had been measured ahead of time with an interferometer, which revealed a straight line at the transmission wavefront (that is, this material undergoes almost no fluctuation in refractive index). With Example 22, the interference pattern remain virtually unchanged after joining, whereas with Comparative Example 22, a wavefront curve (ring-shaped wavefront) was observed, which confirmed that the joining state had deteriorated extremely badly.

Example 23

Figure 21:
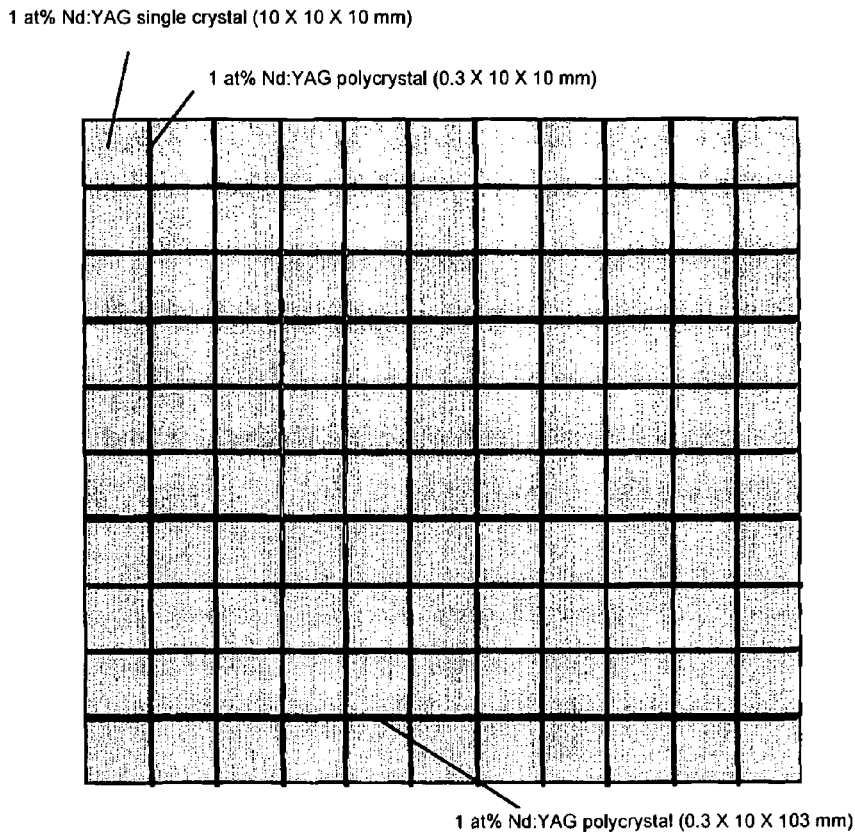
FIG. 21 is a schematic diagram illustrating the structure of the composite laser element of Example 23.

A composite laser element having the structure shown in FIG. 21 was produced.

A Nd:YAG single crystal measuring 3 to 6 inches in diameter can be manufactured by CZ method, but because there is a core in the center, and there are facets or other such optical non-uniform portions present from the center out toward the periphery, even if the ingot is cut into round slices, then cannot be used as laser elements. In general, a portion that has relatively good optical uniformity is detected with an interferometer, and this portion is cut out, and this means that the cut must be made in the direction of crystal growth (the lengthwise direction of the crystal). Consequently, even if a relatively long crystal can be cut out, it is nearly impossible to manufacture a laser element with a large surface area.

In view of this, a large surface area laser element was produced utilizing the present invention. First, a good-quality portion was cut out in a size of 10×10×170 mm long from a Nd:YAG single crystal ingot. The two faces opposing each other in the lengthwise direction of the crystal were optically polished to an Ra of 0.1 nm and $\lambda/10$, after which cuts were made at 10 mm intervals. The polished faces of the cut, cube-shaped Nd:YAG single crystals were brought into contact with each other, and ten were stacked in one direction. Furthermore, both sides of Nd:YAG polycrystals (10×10×0.3 mm) with the same composition as the single crystal were optically polished to the same planar precision as the above-mentioned single crystal and inserted between the single crystals, and the parts were aligned so that the overall shape was a straight line.

After this, this product was held for 3 hours at 1750° C. while pressure of 3 kg/cm² was applied uniaxially in the joining direction. A total of ten elements with a length of approximately 103 mm were produced, each consisting of ten Nd:YAG single crystals and nine Nd:YAG polycrystals in the spaces between these. Two of the non-joined faces (10×103 mm) of these ten elements were optically polished to an Ra of 0.1 nm and $\lambda/10$, after which the polished faces were brought into contact and ten of these were stacked up. Nd:YAG polycrystals (10×103×0.3 mm) having the same composition as above were optically polished to an Ra of 0.1 nm, after which ten polished elements were inserted in the same manner as above, the parts were aligned so that the overall shape was a straight line, and a heat treatment was performed under the same pressure conditions and the same conditions [sic]. A huge element measuring about 103×103×10 mm was obtained here as shown in FIG. 21, in which Nd:YAG single crystals measuring 10 mm square sandwiched Nd:YAG polycrystals with a width of 0.3 mm. Both sides of the element thus produced, which was made up of Nd:YAG single crystals and polycrystals, were optically polished and the transmission wavefront was measured with an interferometer, which revealed the element to be a high-quality element in which the overall refractive index fluctuation ($\Delta n$) matched up on the order of $10^{-5}$. It can be concluded from this that the product was a large surface area laser element capable of laser oscillation.

In the bonding, if a heat treatment was performed for 10 hours at 1790° C. while a temperature gradient of 10° C./cm was applied, the Nd:YAG polycrystal changed into a single crystal, resulting in the entire product being an integrated single crystal. It was also confirmed that the entire product was made into a single crystal by varying the heat treatment conditions in the same process as above. Here again, it was confirmed by interferometer that the transmission wavefront was nearly straight all the way, and reached an order of $\Delta n=10^{-5}$ to $10^{-6}$, so this element can be concluded to be capable of laser oscillation as well.

Example 24

Figure 22:
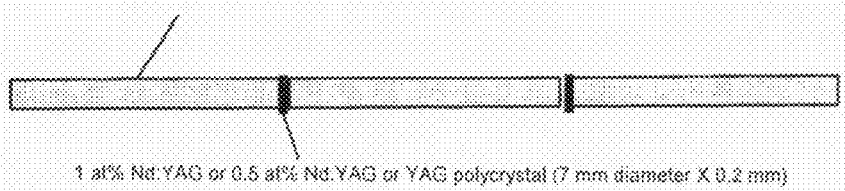
FIG. 22 is a schematic diagram illustrating the structure of the composite laser element of Example 24.

As shown in FIG. 22, a long strip of laser element was produced, which is difficult to manufacture by single crystal growth. The single crystal was commercially available 1 at % Nd:YAG, and this was cut at 150 mm intervals, and the contacting faces were optically polished in the same manner as in Example 23. Also, (1) Nd:YAG of the same composition, (2) a YAG polycrystal with a lower neodymium concentration than the single crystal, and (3) a YAG polycrystal containing no neodymium were prepared and adjusted to a size of 7 mm diameter×0.2 mm, and this product was optically polished in the same manner as in Example 23 and sandwiched between single crystals. The single crystals and polycrystals were arranged in a straight line and heat treated for 3 hours at 1730° C. and a uniaxial pressure of 5 kg/cm$^2$. Both ends in the lengthwise direction of the element were clamped with an alumina ceramic measuring 50 mm long×50 mm×430 mm in order to prevent the single crystals and polycrystals from becoming misaligned, both ends of the joined rod (approximately 450 mm long) were optically polished, and the transmission wavefront was measured by interferometer, which revealed that regardless of which of the polycrystals (1) to (3) was used, the in-plane value was on the order of $\Delta n=10^{-6}$, confirming that an element strip of extremely high uniformity had been obtained. This was a super-long laser element of 450 mm, which is difficult to obtain with conventional single crystal growth technology, and the state of the transmission wavefront leaves no doubt about laser oscillation.

The invention claimed is:
1. A method for manufacturing a composite laser element produced by bonding two or more crystal bodies, wherein:
   (1) at least one of the crystal bodies is a transparent crystal body having a region capable of laser oscillation, and
   (2) the transparent crystal body and/or a second crystal body bonded with the transparent crystal body is a polycrystal, comprising the steps of:
   a) bringing a powder compact of a powder composition that can constitute the transparent crystal body capable of laser oscillation into contact with a powder compact of a powder composition that can constitute the second crystal body, and
   b) heating both powder compacts at a temperature that is 70 to 95% of the melting points of the two powder compacts, to form a composite consisting of the crystal bodies.

* * * * *